US006792586B2

(12) United States Patent
Li

(10) Patent No.: US 6,792,586 B2
(45) Date of Patent: Sep. 14, 2004

(54) CORRECTION OF SPACING VIOLATIONS BETWEEN WIDE CLASS OBJECTS OF DUMMY GEOMETRIES

(75) Inventor: Mu-Jing Li, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/201,044

(22) Filed: Jul. 23, 2002

(65) Prior Publication Data

US 2004/0019866 A1 Jan. 29, 2004

(51) Int. Cl.$^7$ .............................................. G06F 17/50
(52) U.S. Cl. ................... 716/11; 716/8; 716/9; 716/10
(58) Field of Search ............................ 716/4, 5, 8–11; 438/437; 430/5

(56) References Cited

U.S. PATENT DOCUMENTS

| 5,926,723 | A | * | 7/1999 | Wang ........................ 438/437 |
| 5,970,238 | A | | 10/1999 | Shibata et al. |
| 6,011,911 | A | * | 1/2000 | Ho et al. ...................... 716/5 |
| 6,063,132 | A | | 5/2000 | DeCamp et al. |
| 6,189,136 | B1 | * | 2/2001 | Bothra ........................ 716/21 |
| 6,324,673 | B1 | | 11/2001 | Luo et al. |
| 6,418,551 | B1 | | 7/2002 | McKay et al. |
| 6,470,489 | B1 | * | 10/2002 | Chang et al. ................. 716/21 |
| 6,480,995 | B1 | * | 11/2002 | Schmidt et al. ............... 716/11 |
| 6,536,023 | B1 | * | 3/2003 | Mohan et al. .................. 716/5 |
| 6,637,013 | B1 | * | 10/2003 | Li .................................. 716/5 |
| 2001/0039644 | A1 | * | 11/2001 | Le Coz ....................... 716/11 |
| 2002/0127479 | A1 | * | 9/2002 | Pierrat .......................... 430/5 |
| 2003/0061583 | A1 | | 3/2003 | Malhotra |
| 2004/0019867 | A1 | * | 1/2004 | Li ................................ 716/11 |
| 2004/0025125 | A1 | * | 2/2004 | Li .................................. 716/5 |

OTHER PUBLICATIONS

Barnes, "Skill: A CAD System Extension Language," 1990 27th ACM/IEEE Design Automation Conference, pp. 266–271.*

Karam et al., "High Level CAD Melds Microsystems with Foundries," 1996 European Design and Test Conference, pp. 442–447.*

Luo et al., "An Edge–Endpoint–Based Configurable Hardware Architecture for VLSI CAD Layout Design Rule Checking," 1999 7th Annual IEEE Symposium on Field–Programmable Custom Computing Machines, pp. 158–167.*

Yu Chen et al., "Hierarchical Dummy Fill for Process Uniformity," Proc. Asia and South Pacific Design Automation Conf, Jan. 2001, pp. 139–144.

(List continued on next page.)

Primary Examiner—Vuthe Siek
Assistant Examiner—Naum B Levin
(74) Attorney, Agent, or Firm—Zagorin, O'Brien & Graham LLP

(57) ABSTRACT

Automated techniques to correct certain rule violations with respect to non-design geometries are used, simplifying and automating the design layout of an electronic circuit, whether embodied as a design encoding or as a fabricated electronic circuit. Correcting minimum spacing rule violations between wide class objects of non-design geometries is accomplished by deducting an enlarged wide class object of a first non-design geometry from a second non-design geometry; wherein the enlarged wide class object of the first non-design geometry is formed by enlarging a wide class object of the first non-design geometry at one or more non-virtual edges of the wide class object of the first non-design geometry but not at one or more virtual edges of the wide class object of the first non-design geometry wherein the wide class object of the first non-design geometry has at least one virtual edge.

42 Claims, 20 Drawing Sheets

OTHER PUBLICATIONS

Andrew B. Kahng et al., "Filling Algorithms and Analyses for Layout Density Control," IEEE Trans. Computer Aided Design 18(4) (1999) pp. 445–462.

U.S. patent application No. 10/201,102, titled "Automated Design Rule Violation Correction When Adding Dummy Geometries to a Design Layout" filed Jul. 23, 2002, naming inventor Mu–Jing Li.

U.S. patent application No. 10/201,072, titled "Correction of Spacing Violations Between Dummy Geometries and Wide Class Objects of Design Geometries" filed Jul. 23, 2002, naming inventor Mu–Jing Li.

U.S. patent application No. 10/201,071, titled "Correction of Spacing Violations Between Design Geometries and Wide Class Objects of Dummy Geometries" filed Jul. 23, 2002, naming inventor Mu–Jing Li.

U.S. patent application No. 10/201,101, titled "Correction of Width Violations of Dummy Geometries" filed Jul. 23, 2002, naming inventor Mu–Jing Li.

* cited by examiner

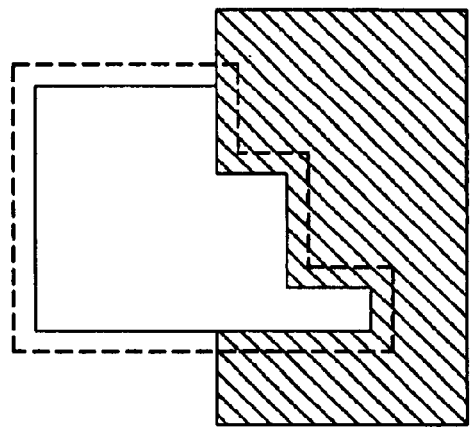
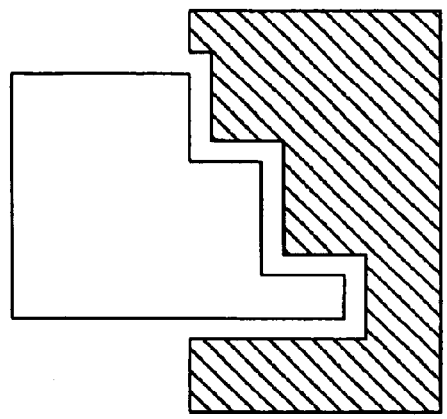
FIG. 4A  FIG. 4B
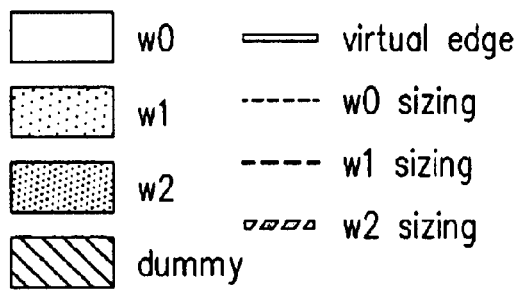
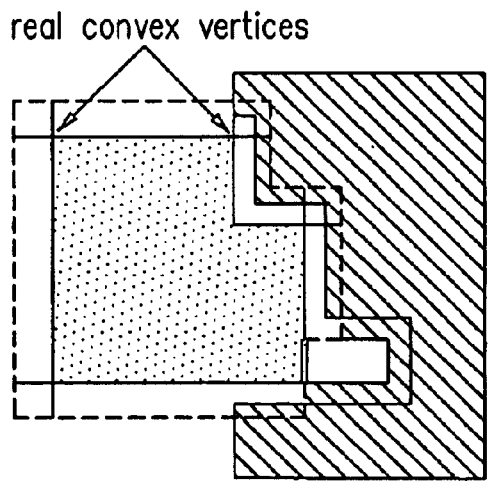
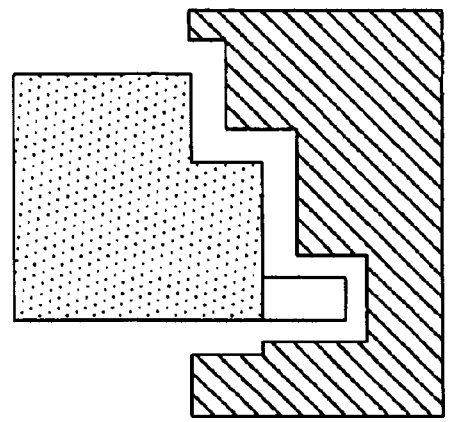
FIG. 4C  FIG. 4D

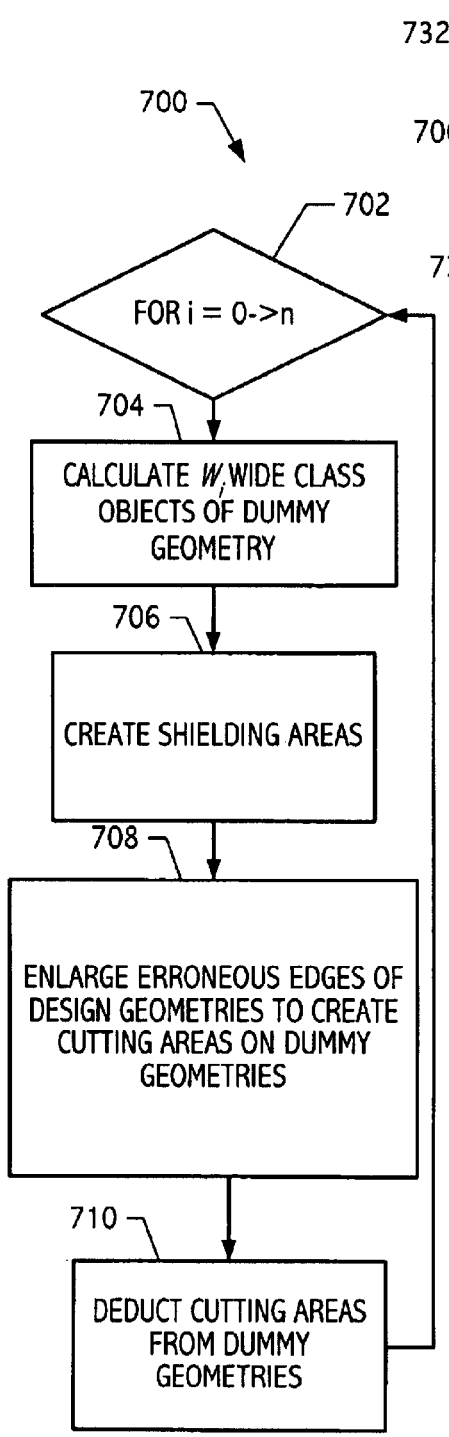
FIG. 7A
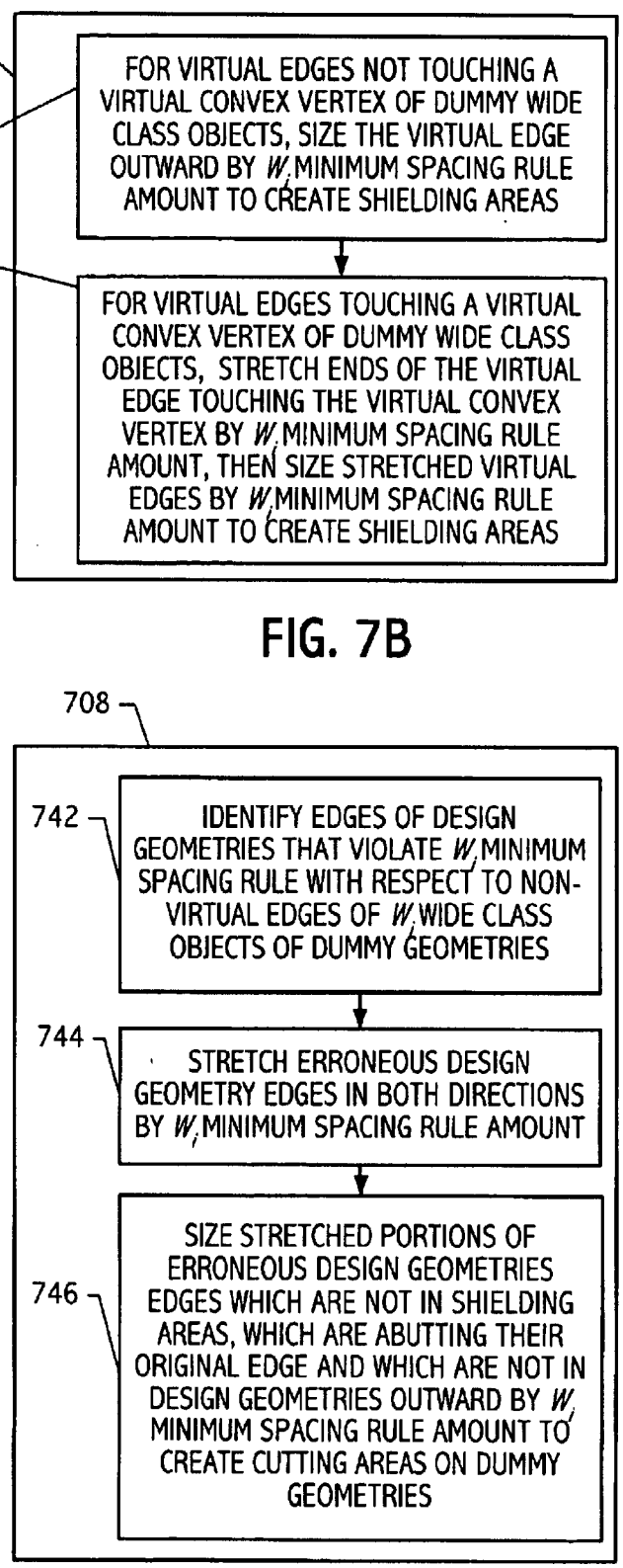
FIG. 7B
FIG. 7C

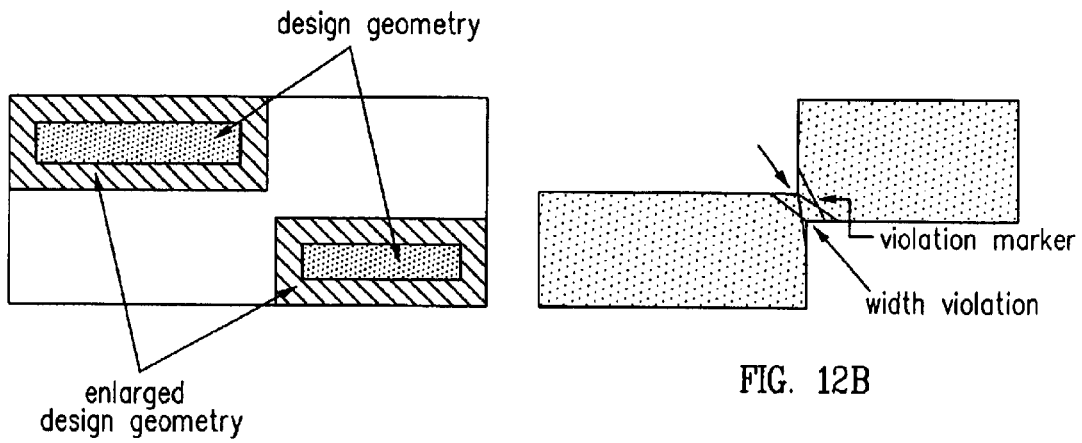
FIG. 12A
FIG. 12B
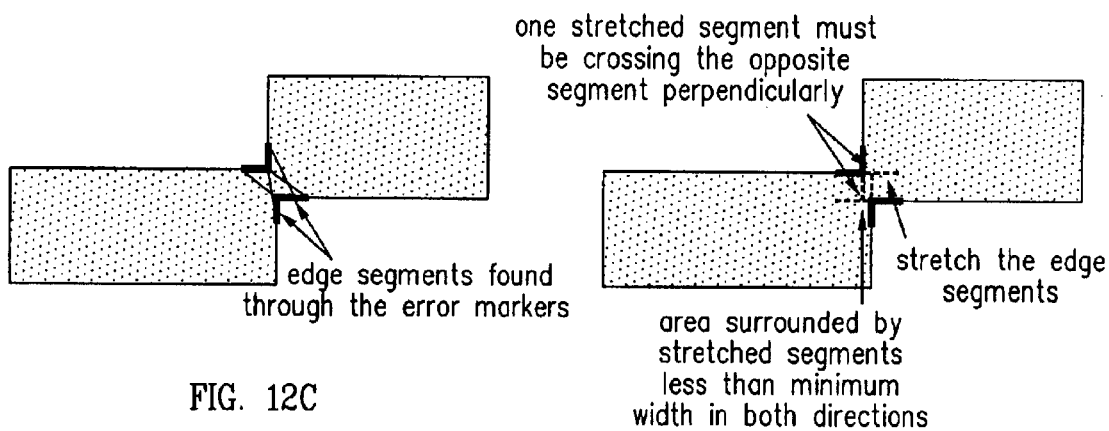
FIG. 12C
FIG. 12D
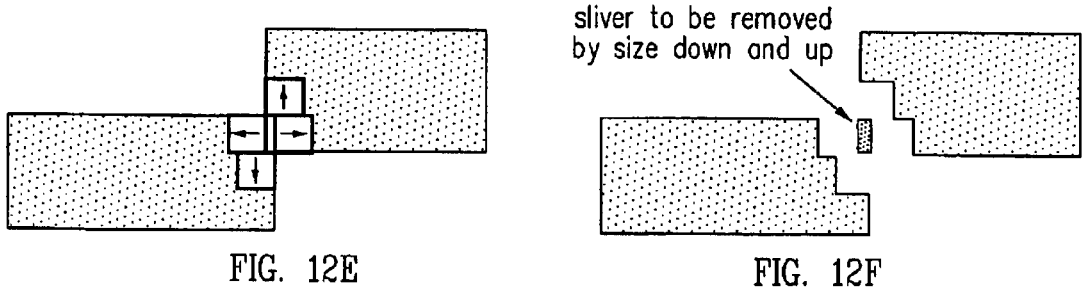
FIG. 12E
FIG. 12F

CORRECTION OF SPACING VIOLATIONS BETWEEN WIDE CLASS OBJECTS OF DUMMY GEOMETRIES

CROSS-REFERENCE TO RELATED APPLICATION(S)

This application is related to (1) U.S. patent application Ser. No. 10/201,102 entitled "AUTOMATED DESIGN RULE VIOLATION CORRECTION WHEN ADDING DUMMY GEOMETRIES TO A DESIGN LAYOUT," naming Mu-Jing Li as inventor, and filed on even date herewith and now U.S. Pat. No. 6,718,527, to (2) U.S. patent application Ser. No. 10/201,072 entitled "CORRECTION OF SPACING VIOLATIONS BETWEEN DUMMY GEOMETRIES AND WIDE CLASS OBJECTS OF DESIGN GEOMETRIES," naming Mu-Jing Li as inventor, and filed on even date herewith, to (3) U.S. patent application Ser. No. 10/201,071 entitled "CORRECTION OF SPACING VIOLATIONS BETWEEN DESIGN GEOMETRIES AND WIDE CLASS OBJECTS OF DUMMY GEOMETRIES," naming Mu-Jing Li as inventor, filed on even date herewith, to (4) U.S. patent application No. 10/201,101 entitled "CORRECTION OF WIDTH VIOLATIONS OF DUMMY GEOMETIES," naming Mu-Jing Li as inventor, filed on even date herewith. Each of the related applications is incorporated herein by reference in its entirety.

BACKGROUND

1. Field of the Invention

This invention relates to electronic circuits and more particularly to complex computer aided design layout and design rule verification of a design layout of, for example, an integrated circuit (IC) device or printed wiring board, in preparation for fabrication.

2. Description of the Related Art

Design of an electronic circuit, for example, an integrated circuit (IC), is a complicated and time consuming process. FIG. 1 illustrates a typical design flow 100 of an integrated circuit device from conception through the generation of a fabrication ready design layout. Generally, design flow 100 commences with defining the design specifications or requirements, such as required functionality and timing, step 102. The requirements of the design are implemented, for example, as a net-list or electronic circuit description, step 104. The implementation can be performed by, for example, schematic capture (drawing the design with a computer aided design tool) or more typically, utilizing a high level description language such as VHDL, Verilog and the like. The implemented design is simulated to verify design accuracy, step 106. Design implementation and simulation are iterative processes. For example, errors found by simulation are corrected by design implementation and re-simulated.

Once the design is verified for accuracy with simulation, a design layout of the design is created, step 108. The design layout describes the detailed design geometries and the relative positioning of each design layer to be used in actual fabrication. The design layout is very tightly linked to overall circuit performance (area, speed and power dissipation) because the physical structure defined by the design layout determines, for example, the transconductances of the transistors, the parasitic capacitances and resistances, and the silicon area which is used to realize a certain function. The detailed design layout requires a very intensive and time-consuming design effort and is typically performed utilizing specialized computer aided design (CAD) or Electronic Design Automation (EDA) tools.

The design layout is checked against a set of design rules in a design rule check (DRC), step 110. The created design layout must conform to a complex set of design rules in order, for example, to ensure a lower probability of fabrication defects. The design rules specify, for example, how far apart various layers must be, or how large or small various aspects of the layout must be for successful fabrication, given the tolerances and other limitations of the fabrication process. A design rule can be, for example, a minimum spacing amount between geometries and is typically closely associated to the technology, fabrication process and design characteristics. For example, different minimum spacing amounts between geometries can be specified for different sizes of geometries. DRC is a time-consuming iterative process that often requires manual manipulation and interaction by the designer. The designer performs design layout and DRC iteratively, reshaping and moving design geometries to correct all layout errors and achieve a DRC clean (violation free) design.

Circuit extraction is performed after the design layout is completed and error free, step 112. The extracted circuit identifies individual transistors and interconnections, for example, on various layers, as well as the parasitic resistances and capacitances present between the layers. A layout versus schematic check (LVS) is performed, step 114, where the extracted net-list is compared to the design implementation created in step 104. LVS ensures that the design layout is a correct realization of the intended circuit topology. Any errors such as unintended connections between transistors, or missing connections/devices, etc. must be corrected in the design layout before proceeding to post-layout simulation, step 116. The post-layout simulation is performed using the extracted net-list which provides a clear assessment of the circuit speed, the influence of circuit parasitics (such as parasitic capacitances and resistances), and any glitches that can occur due to signal delay mismatches. Once post-layout simulation is complete and all errors found by DRC are corrected, the design is ready for fabrication and is sent to a fabrication facility.

As electronic circuit densities increase and technology advances, for example, in deep sub-micron circuits, skilled designers attempt to maximize the utilization of the design layout and manufacturability and reliability of the circuit. For example, the density can be increased, redundant vias added, and the like. Creation of a design layout and performing DRC become critical time consuming processes. Performing a DRC and manipulation of the design layout often requires manual interaction from the designer. A reliable, automated technique for improving the design layout is needed.

SUMMARY

Accordingly, it has been discovered that automated techniques to correct certain rule violations with respect to non-design geometries can be used, simplifying and automating the design layout of an electronic circuit, whether embodied as a design encoding or as a fabricated electronic circuit.

Accordingly, in one embodiment, correcting minimum spacing rule violations between wide class objects of non-design geometries is accomplished by deducting an enlarged wide class object of a first non-design geometry from a second non-design geometry; wherein the enlarged wide class object of the first non-design geometry is formed by enlarging a wide class object of the first non-design geometry at one or more non-virtual edges of the wide class object of the first non-design geometry but not at one or more virtual edges of the wide class object of the first non-design geometry wherein the wide class object of the first non-design geometry has at least one virtual edge.

In another embodiment, deducting an enlarged wide class object of the second non-design geometry from the first non-design geometry is performed; wherein the enlarged wide class object of the second non-design geometry is formed by enlarging a wide class object of the second non-design geometry at one or more non-virtual edges of the wide class object of the second non-design geometry.

In another embodiment, the wide class object of the first geometry is of a same wide class as the wide class object of the second design geometry and more area is deducted from the first non-design geometry and the second non-design geometry than is needed to meet a minimum spacing rule.

In another embodiment, the wide class object of the first geometry is of a different wide class as the wide class object of the second design geometry and only enough area is deducted from the first non-design geometry and the second non-design geometry to meet a minimum spacing rule.

In another embodiment, enlarging the wide class object of the first non-design geometry is accomplished by creating corner clearance areas from non-virtual convex vertices of the wide class object of the first non-design geometry; creating edge to edge spacing clearance areas from non-virtual edges of the wide class object of the first non-design geometry; and combining the corner clearance areas and the edge to edge spacing clearance areas to form the enlarged wide class object of the first non-design geometry.

In another embodiment, creating corner clearance areas is accomplished by stretching non-virtual edges that form the non-virtual convex vertices of the wide class object of the first non-design geometry by a minimum spacing rule amount creating stretched edges; and sizing the stretched edges by the minimum spacing rule amount.

In another embodiment, creating edge to edge spacing clearance areas is accomplished by sizing non-virtual edges of the wide class object of the first non-design geometry by a minimum spacing rule amount.

In another embodiment, the first non-design geometry and the second non-design geometry are dummy geometries.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIGS. 4A–4F illustrate the manipulation of a dummy geometry to correct spacing violations between the dummy geometry and wide class objects of a design geometry according to some embodiments of the present invention.

FIGS. 7A–7D illustrate flows 700 and 750 for correcting spacing violations between design geometries and wide class objects of dummy geometries according to some embodiments of the present invention.

FIGS. 12A–12F illustrate the manipulation of dummy geometries to correct width violations of dummy geometries according to some embodiments of the present invention.

The use of the same reference symbols in different drawings indicates similar or identical items.

DESCRIPTION OF THE PREFERRED EMBODIMENT(S)

Figure 1:
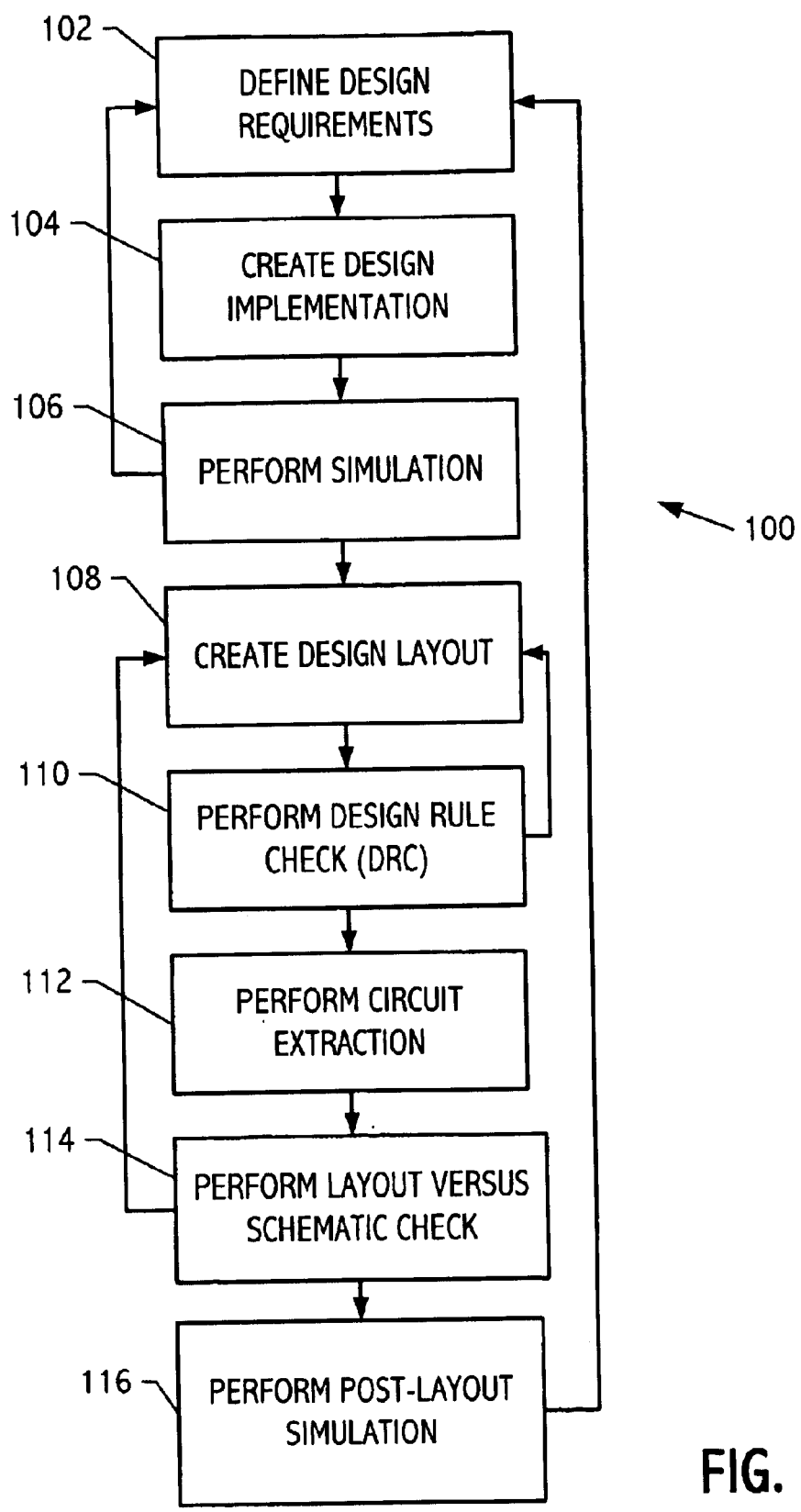
FIG. 1, prior art, illustrates an exemplary design flow 100 for an integrated circuit device.
Figure 2A:
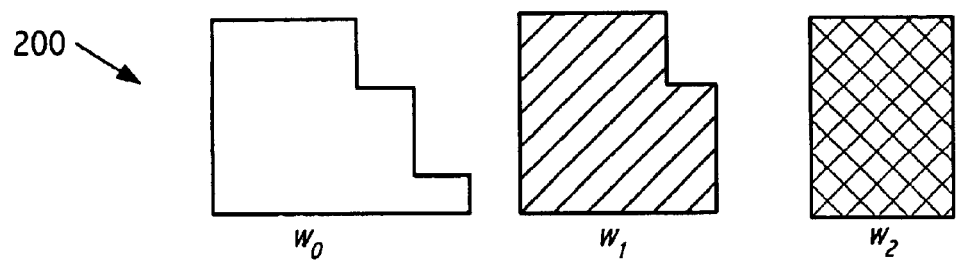
FIGS. 2A–2E illustrate various geometries and their features as utilized by some embodiments of the present invention.

FIGS. 2A–2E illustrate various geometries and their features as utilized by some embodiments of the present invention. A geometry can be metal or polysilicon, or other such material. As illustrated in FIG. 2A, a geometry 200 can be of irregular shape. The irregular shape of a geometry can be due to reshaping of the geometry to conform to design rules, allowance for via placement, and other such design reasons.

Design rules are typically different for different sized geometries. For example, larger geometries require a larger amount of space between other geometries than is required by smaller geometries. Because the design rules are typically different for different sized geometries, geometries are often classified according to size. Classifying a shape such as geometry 200 can lead to several options. For example, geometry 200 can be classified according to its widest edge, applying worst case spacing requirements. Applying the worst case spacing requirements is not a desirable classification for space restricted designs.

According to some embodiments of the present invention, a design can have multiple wide classes defined, and a geometry can have multiple wide class objects of varying edges and widths, $w_0$–$w_n$, derived from it. Design rules are applied to each wide class object individually, resulting in a much more optimal layout. Wide class objects are derived from a geometry according to its shape and size. A wide class of a particular geometry can have any number of wide class objects, including zero. However, a particular geometry has one and only one $w_0$ wide class object, representing the geometry. Thus, "$w_0$" and "geometry" are interchangeable. Further, a $w_0$ wide class object does not need to be derived or calculated because all edges are coincident with the geometry. As illustrated in FIG. 2A, geometry 200 has three wide classes, each having one object: $w_0$, $w_1$, and $w_2$.

Figure 2C:
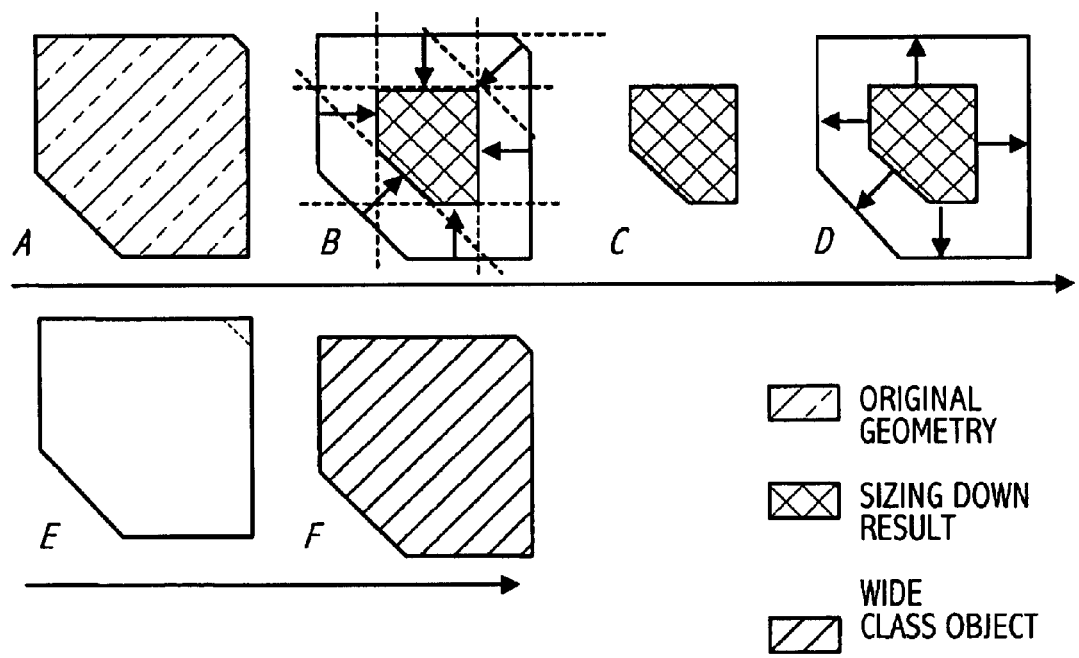
Figure 2B:
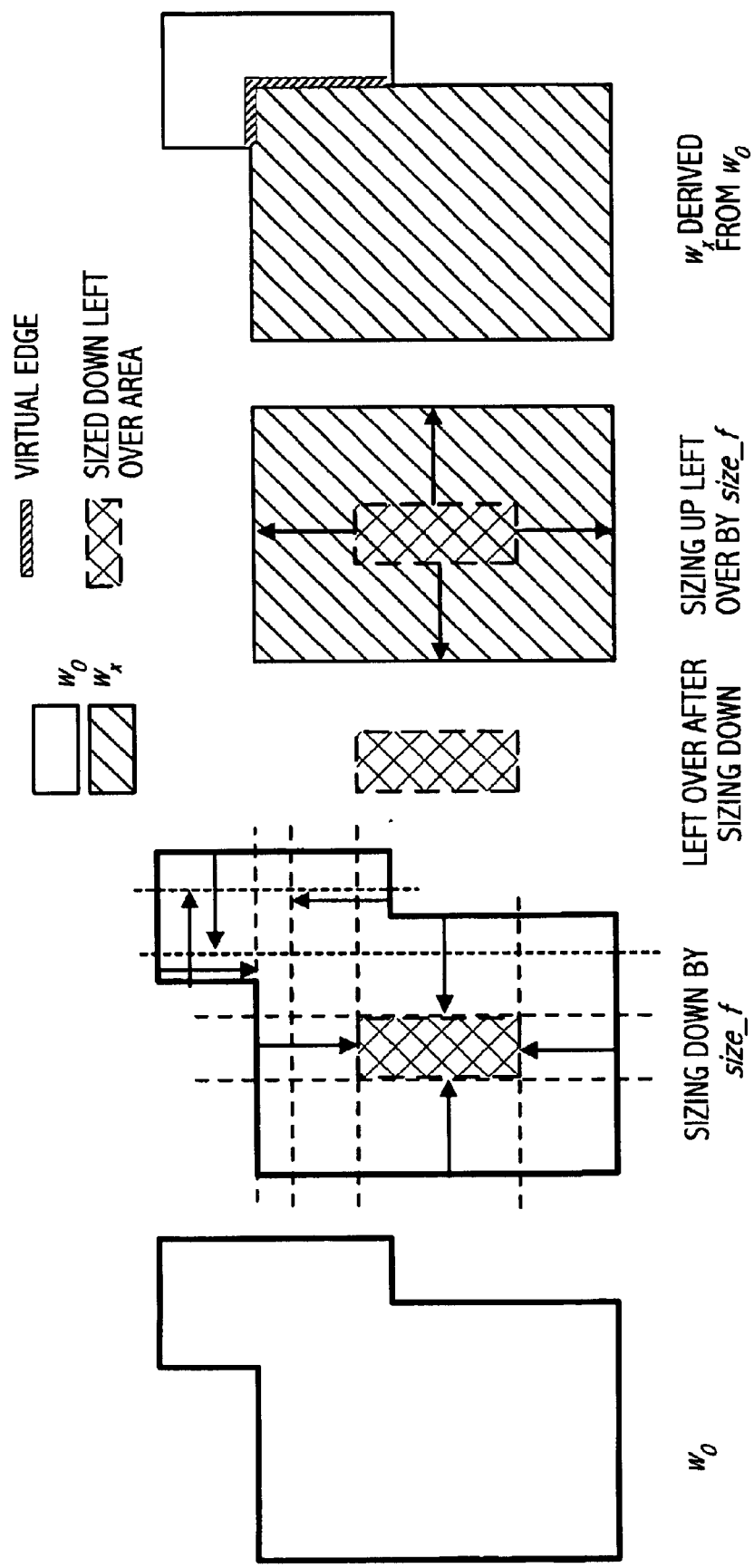

FIG. 2B illustrates the deriving of wide class objects from a geometry according to some embodiments of the present invention. Typically, a sizing down and sizing up operation is performed on the edges of the geometry, for example, using an electronic design automation (EDA) tool. If any portion of the geometry remains after the sizing operations, the remaining portion(s) is defined as a wide class object(s). Wide class objects are objects which are derived from the geometries, and can be exactly the same as the geometries, or can be a smaller portion of the geometry. A sizing factor is typically slightly less than one half of the wide class width amount. The sizing down operation pushes each edge of the geometry inward by the sizing factor, eliminating areas in the geometry with width less than the wide class width amount in any dimension. In other words, sizing down deletes any small areas of the geometries which are not wide enough to pass the operation. The sizing up operation expands the remaining sized down geometry outward by the sizing factor. Thus, any small areas of the geometries are removed to form the wide class object. Therefore, after the pair of operations, the resulting wide class object can be of a different shape from the geometry. For a design with n wide classes, the sizing down and up operations are repeated n times, each with the corresponding wide class width amount and sizing factor. Wide class objects are identified as $w_0$, $w_1$, ... $w_n$ with $w_0$ having all edges coincident with the geometry, and $w_1$, ... $w_n$ as objects with increasing wide class width amounts and, for example, increasing minimum spacing rule amounts.

An exemplary code segment written in Diva language code to perform sizing down and sizing up operations according to some embodiments of the invention is illustrated below. Diva is a registered trademark of Cadence Design Systems, Inc. Line 1 defines the sizing factor to be slightly less (one tenth of a grid) than ½ of the wide class width amount. Line 2 performs a sizing down operation (geomsize the geometry by a negative sizing factor) and a sizing up operation (geomsize the sizing down result by a positive sizing factor). Line 3 performs an AND operation, explained below.

```
1  size_f    = MtxWidth/2-TenthGrid
2  dm_mtx    = geomSize (geomSize (dm_mtx_orig -size_f)
               size_f)
3  dm_mtx    = geomAnd (dm_mtx dm_mtx_orig)
```

An extra operation is performed for non-orthogonal geometries (those with non-square edges, for example, slant edges) to define the wide object classes. An AND operation is performed between the result of the sizing operations with the geometry to ensure that the wide class object does not have any edges outside of the edges of the geometry. FIG. 2C illustrates this additional operation. As illustrated, the AND operation is needed to remove the erroneous top right corner of the wide class object.

Figure 2D:
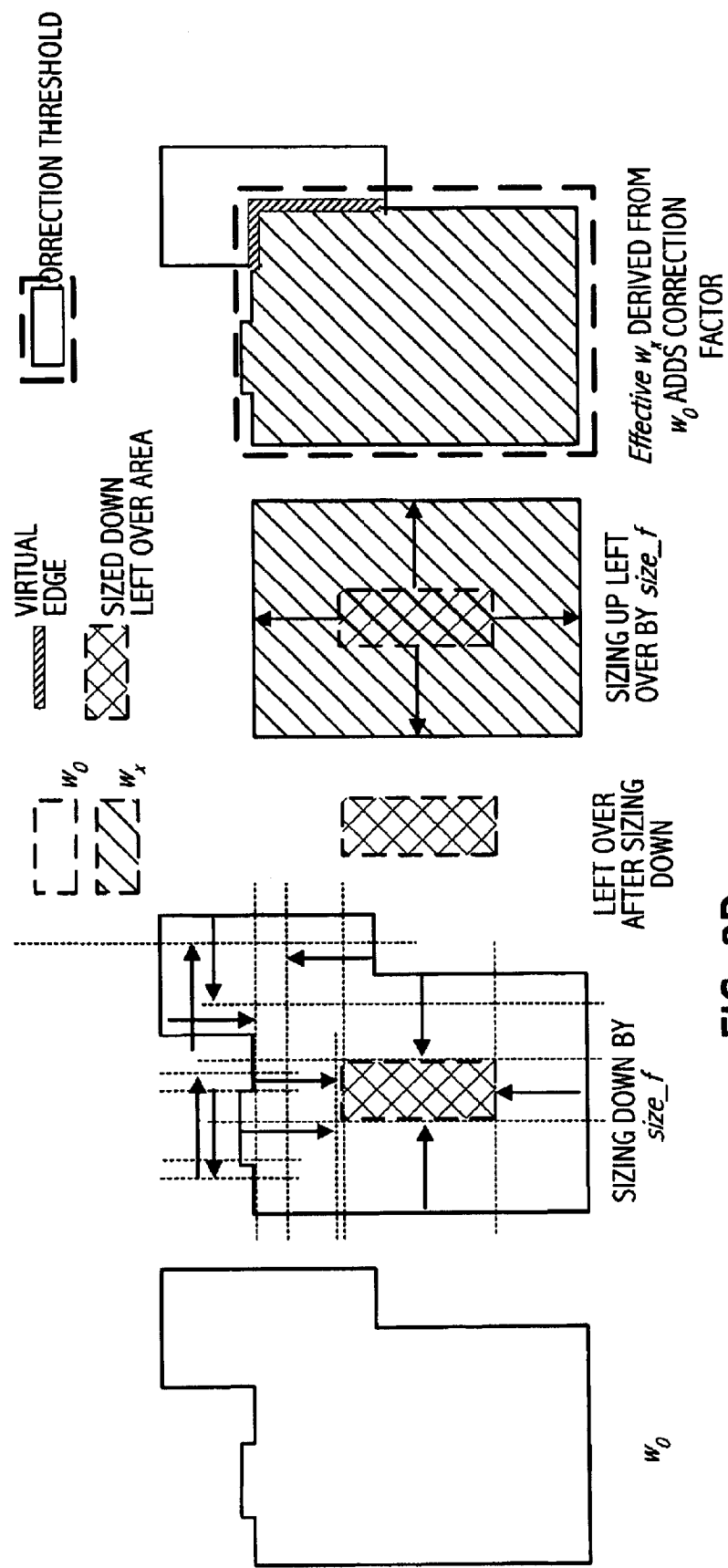

Typically, a correction factor is used to define effective wide class objects because even very small areas of the geometry can be filtered from the wide class objects. These small areas of the geometry typically display wide class object characteristics in circuit operation and therefore optimally should be taken into account. To include these small areas along with the wide class objects, a threshold or correction factor is used. The threshold amount can be set according to the fabrication process. If an area is adjacent to a wide class object and the width of the area is smaller than the threshold, the area is included as part of the wide class object. FIG. 2D illustrates an effective wide class object in which a small area is included in the definition of the wide class object because the small area is completely inside the threshold. Throughout the following discussions, the use of the term "wide class object" is intended to include both wide class objects created from the sizing down and sizing up operations and effective wide class objects.

Figure 2E:
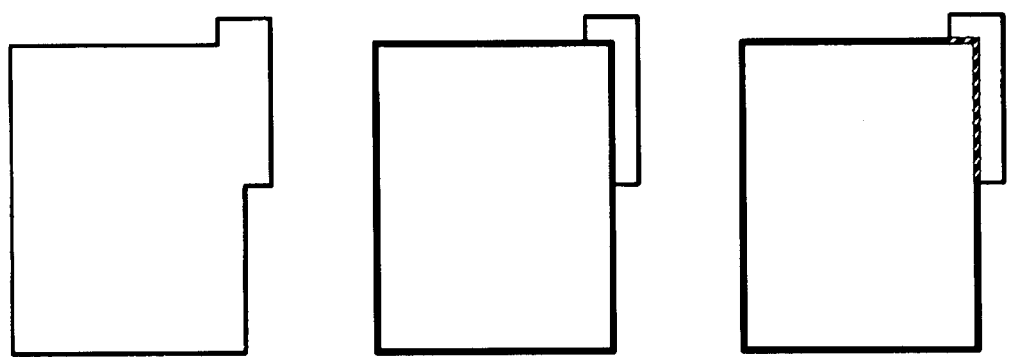
Figure 2E:
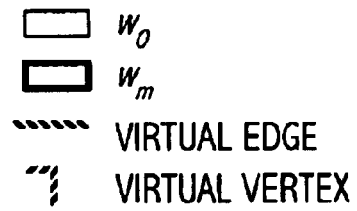

Wide class objects are not real geometries and are artificial objects. The concept of a virtual edge is used when manipulating geometries to meet design rules to manage certain complications introduced by deriving multiple wide class objects from a geometry. Although $w_0$ objects contain all real edges (i.e., non-virtual edges) which are coincident with the edges of the geometry, $w_1$–$w_n$ objects can contain virtual edges. A virtual edge is defined as an edge or an edge segment of an artificial object that is not coincident with an edge of the geometry. In other words, a virtual edge is coincident with a wide class object edge and is inside the geometry. A virtual vertex is a vertex on the wide class object formed by two virtual edges touching perpendicularly, but is not a real vertex on the geometry. FIG. 2E illustrates a wide class object with virtual edges and a virtual vertex. Virtual edges are utilized when manipulating geometries to meet design rules. For example, in performing a design rule check between wide class objects and geometries, the wide class minimum spacing rule is applied to only non-virtual edges and non-virtual vertices. A non-virtual (or real) vertex is a vertex formed by two non-virtual edges touching perpendicularly. In another example, virtual edges are filtered to avoid false errors.

Automated Design Rule Violation Correction when Adding Dummy Geometries to a Design Layout When producing a design layout of an electronic circuit, design geometries are shaped and sized to conform to design rules and other design specifications. Once all of the design geometries are shaped, sized, and located in a design layout, the design layout can be further manipulated to optimize the fabrication and reliability of the electronic circuit. For example, dummy geometries can be added to the design layout to increase the density of one or more layers of an IC device, reduce operating noise by tying the dummy geometries to power or ground, and provide area for additional vias when a dummy geometry is merged with a design geometry.

When adding dummy geometries to the design layout, these added geometries should also conform to design rules, for example, width and spacing rules to design geometries and other added dummy geometries. For a design with multiple wide classes, each wide class typically has a different minimum spacing rule. Wide class objects can contain virtual edges and virtual vertices which should be specially handled when performing DRC and manipulating geometries. During the original design layout, design geometries can be shaped and reshaped to conform to design rules. However, after the design is completed and when adding dummy geometries, only violating portions of dummy geometries can be cut or removed from the design layout to conform to design rules. Determining optimum areas to be removed from dummy geometries or the positioning of dummy geometries at optimum locations without introducing design rule violations to correct other design rule violations is a complex process.

Figure 3:
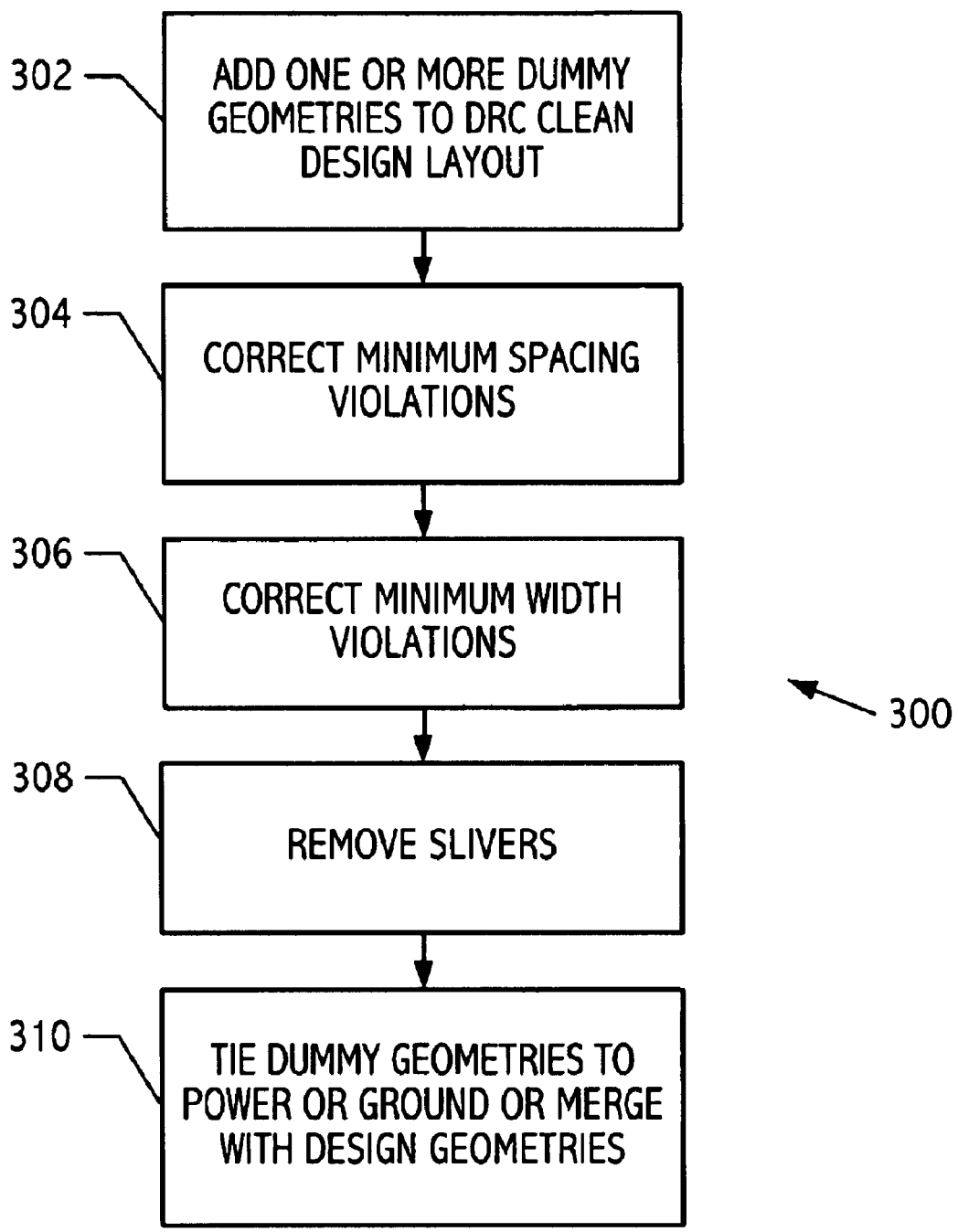
FIG. 3 illustrates a flow 300 for correction of design rule violations created when adding dummy geometries to a design layout according to some embodiments of the present invention.

FIG. 3 illustrates a flow 300 for correction of design rule violations created when adding dummy geometries to a design layout according to some embodiments of the present invention. Flow 300 is an automated error correction process such that the design flow continues without requiring interaction or manual correction in the middle of the flow.

Referring to FIG. 3, a dummy geometry or pattern of dummy geometries is added to a DRC clean design layout covering all or a portion of one or more design geometries, step 302. Minimum spacing violations are corrected, step 304. The correction of minimum spacing violations is further described in relation to FIGS. 4A–10. Minimum width violations are corrected, step 306. The correction of minimum spacing violations is further described in relation to FIGS. 11A–13. During steps 304 and 306, dummy geometries are typically cut to conform to minimum spacing rules and can be split into multiple geometries. Note that when cutting dummy geometries, special care must be taken such that cutting areas are from the edges of the dummy geometry and not from a virtual edge of a wide class object. For example, if a cutting area is from a virtual edge of a wide class object, a hole or opening can be formed in the dummy geometry which is unacceptable and will generate additional design rule violations.

Generally, cutting areas are generated by stretching erroneous edges and then sizing outwards by minimum spacing requirements. Thus, the design layout, including the design geometries and dummy geometries, conforms to minimum spacing requirements. Cutting areas are determined for each wide class object and associated wide class design rules. Virtual edges must be specially handled such that proper cutting areas are created based on real erroneous edges. After deducting the cutting areas, the erroneous geometries might be separated slightly more than what is needed to conform to the design spacing requirements. After deducting cutting areas from dummy geometries, one or more wide class objects of dummy geometries may need to be recalculated because the wide class objects of the dummy geometries may have changed.

According to an embodiment of the present invention, special handling occurs to ensure that only dummy geometries are cut to correct design rule violations. In addition, when dealing with wide class objects of dummy geometries, special handling occurs to ensure that any areas cut must be from edges of the dummy geometry and not from the virtual edges of a wide class object of the dummy geometry. Otherwise, a hole can occur in the center of the dummy geometry. For example, when correcting spacing violations between design geometries and wide class objects of dummy geometries as illustrated in FIGS. 6A–6G and FIGS. 7A–7D, violation information must be reflected back to the dummy geometry from the design geometry to form cutting areas.

Any slivers of dummy geometries (those which are smaller than minimum rule size) are removed, step 308. The removal of slivers can be performed automatically using sizing down and sizing up operations similar to those used in defining wide class objects. The remaining dummy geometries are tied to power or ground or merged with design geometries, step 310

According to one embodiment of the invention, related and unrelated dummy geometries are handled differently when correcting design rule violations. A related dummy geometry has some relationship to another geometry. For example, if a particular dummy geometry is added to a design layout to increase the size of a particular design geometry to, for example, add more area for the placement of vias, the two geometries are related and minimum spacing violations between the coincident edges of the two geometries (where the two geometries will be joined) can be ignored.

Figure 4E:
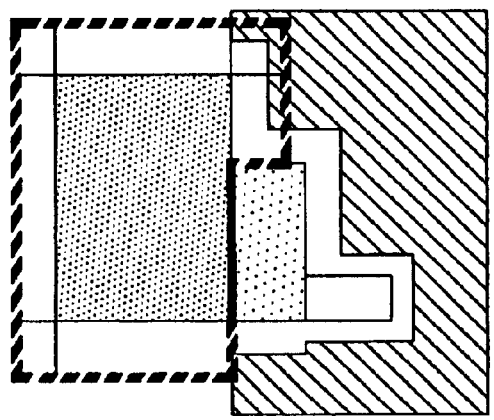
Figure 4F:
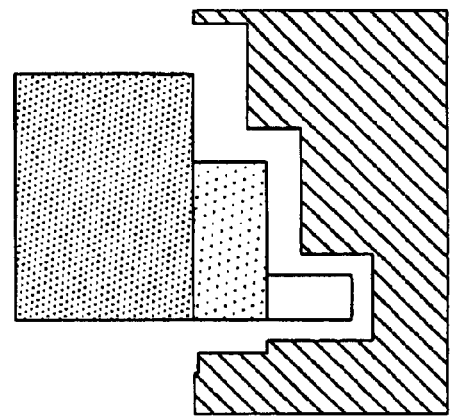
Figure 5:
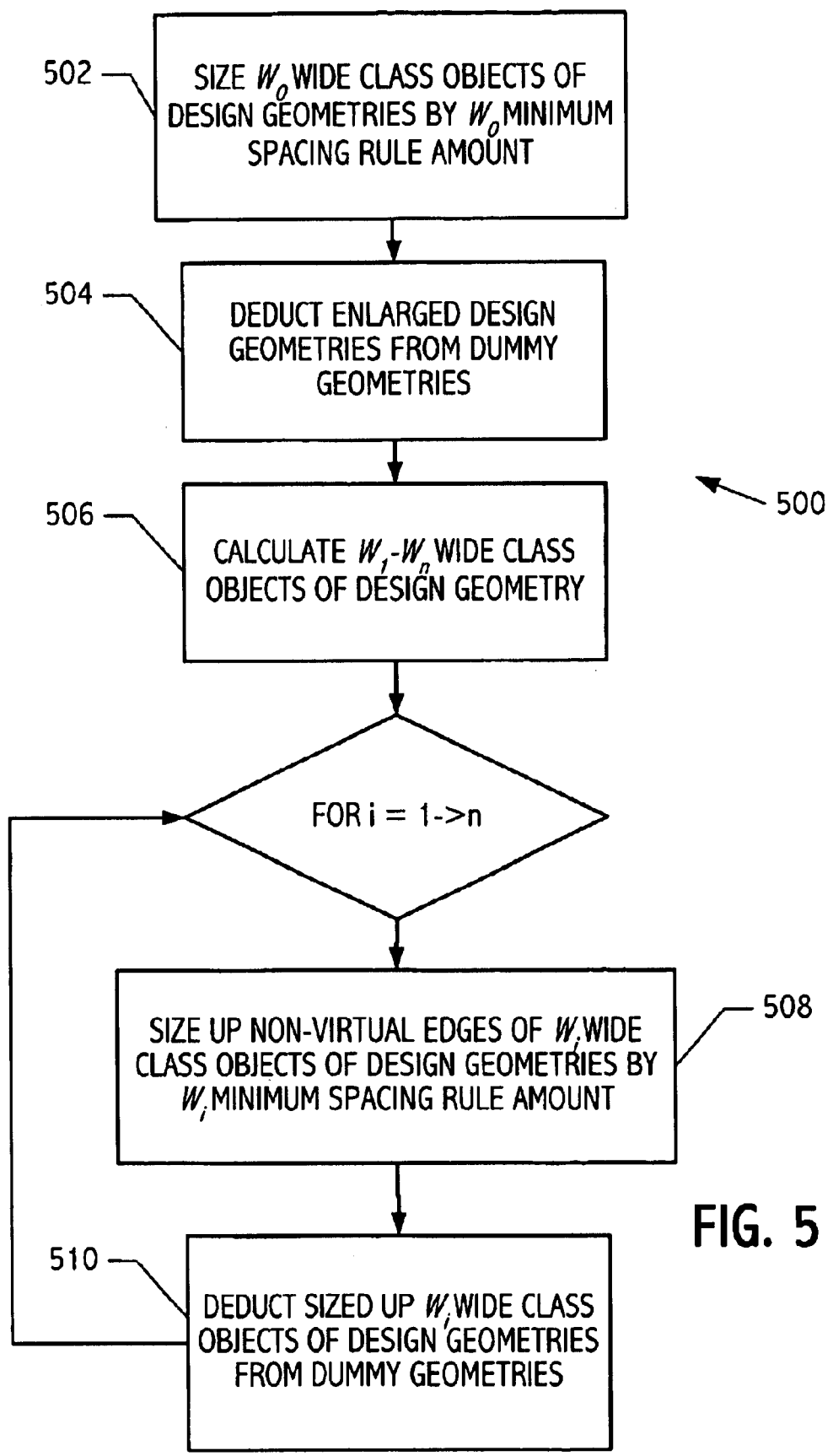
FIG. 5 illustrates a flow 500 for correcting spacing violations between dummy geometries and wide class objects of design geometries according to some embodiments of the present invention.

Correction of Spacing Violations Between Dummy Geometries and Wide Class Objects of Design Geometries FIGS. 4A–4F illustrate the manipulation of a dummy geometry to correct spacing violations between the dummy geometry and wide class objects of a design geometry according to some embodiments of the present invention. FIG. 5 illustrates a flow 500 for correcting spacing violations between dummy geometries and wide class objects of design geometries according to some embodiments of the present invention. As illustrated in FIG. 4A, a $w_0$ wide class object of a design geometry is enlarged by the $w_0$ minimum spacing rule amount, step 502. As previously noted, the edges of a $w_0$ wide class object are non-virtual edges and are coincident with the geometry. As illustrated in FIG. 4B, the enlarged design geometry is deducted from the dummy geometry, step 504. The $w_1$–$w_n$ wide class objects of the design geometry are calculated, step 506. Note that the $w_0$ wide class object does not need to be calculated because $w_0$ has the same edges as the geometry. Also note that step 506 can occur at any time prior to step 508. Also, because design geometries do not change in flow 500, the $W_1$–$w_n$ wide class objects of the design geometries can be calculated all at once and do not need to be recalculated after deductions to dummy geometries. Steps 508 and 510 are repeated for each wide class object from $w_1$–$w_n$. N can be any integer, including 1. As illustrated in FIGS. 4C and 4E, non-virtual edges of the $w_i$ wide class objects of the design geometries are sized up by the $w_i$ minimum spacing rule amount, step 508. As illustrated in FIGS. 4D and 4F, the sized p $w_i$ wide class objects of the design geometries (i.e., the areas of overlap) are deducted from dummy geometries, step 510.

According to an embodiment of the present invention, to size the non-virtual edges, edges ending at a real convex vertex are stretched by the $w_i$ minimum spacing rule amount, and only those stretched edge segments which are outside $w_0$ and equal to the $w_i$ minimum spacing rule amount are combined with the original edges to form the sizing edges. Note that stretching an edge elongates the length of the edge while sizing an edge creates a rectangular area. Sizing is typically performed in the outward direction, i.e., away from the center of the object.

An exemplary code segment written in Diva language code to implement an algorithm for correcting minimum spacing violations between dummy geometries and each wide object class of the design geometries according to some embodiments of the present invention is illustrated below. The spacing rules utilized are M1ToM1, M1ToM1Wide1, M1ToM1Wide2, and M1ToM1Wide3 for wide class objects $w_0$, $w_1$, $w_2$, and $w_3$, respectively.

---

```
1  dummy = geomCat (dummy_good)
2  rule_file = sprintf (nil "%s/diva_rules/wmt_edge_size_box.rul"
     DFII_TECH_DIR)
3  w0 = geomCat (ml_good)
4  size_f = M1Wide1/2 - TenthGrid
5  w1 = geomSize (geomSize (w0 -size_f) size_f)
6  w1 = geomAnd (w1 w0)
7  size_f = M1Wide2/2 - TenthGrid
8  w2 = geomSize (geomSize (w1 -size_f) size_f)
9  w2 = geomAnd (w2 w0)
```

-continued

```
10  size_f = M1Wide3/2 - TenthGrid
11  w3 = geomSize (geomSize (w2 -size_f) size_f)
12  w3 = geomAnd (w3 w0)
13  w0_s = geomSize (w0 M1ToM1)
14  dummy = geomAndNot (dummy w0_s)
15  wmt = geomCat (w1)
16  WmtToMt = M1ToM1Wide1
17  load (rule_file)
18  dummy = geomAndNot (dummy edge_ck_s_box)
19  wmt = geomCat (w2)
20  WmtToMt = M1ToM1Wide2
21  load (rule_file)
22  dummy = geomAndNot (dummy edge_ck_s_box)
23  wmt = geomCat (w3)
24  WmtToMt = M1ToM1Wide3
25  load (rule_file)
26  dummy = geomAndNot (dummy edge_ck_s_box)
```

Lines 1–12 calculate the wide class objects of the design geometries utilizing sizing down and up operations, for example in lines 5, 8 and 11. An AND operation for non-orthogonal geometries is performed in steps 6, 9, and 12. Line 13 corresponds to step 502, sizing $w_0$ by the $w_0$ minimum spacing rule amount. Line 14 corresponds to step 504, deducting the sized up design geometries from the dummy geometries. Lines 15–26 correspond to steps 508 and 510, sizing up non-virtual edges of wide class objects and deducting them from the dummy geometries. Lines 17, 21 and 25 call another routine, wmt_edge_size_box.rul, which takes wmt, $w_i$ and WmtToMt as inputs and outputs edge_ck_s_box, which contains the enlarged and properly stretched edge boxes which are ready to be deducted from dummy geometries. The routine wmt_edge_size_box.rul is illustrated below.

```
1  InEdge = geomGetEdge (wmt coincident w0)
2  BaseClass = geomCat (w0)
3  StchSize = WmtToMt
4  rule_file = sprintf (nil "%s/diva_rules/
     convex_stch.rul" DFII_TECH_DIR)
5  load (rule_file)
6  edge_ck_s_box = geomSize (geomOr (edge_v_stch InEdge)
     WmtToMt)
```

Above, in line 1, the real edges of the wide class object are obtained. Lines 2–5 perform the stretching of the real edges of the wide class object. Line 6 performs the sizing of the stretched edges. The routine wmt_edge_size_box.rul calls another routine, convex_stch.rul, which stretches the edge segments of the wide class object on the convex vertices by StchSize. The output edge_v_stch is the stretched edge segments starting from the convex vertices. The routine convex_stch.rul is illustrated below.

```
1   edge_tenth_box = geomSize (InEdge TenthGrid)
2   tenth_edge = geomGetLength (edge_tenth_box length = =
      TenthGrid)
3   tenth_box = geomSize (tenth_edge TenthGrid)
4   v_tenth_box = geomAvoiding (tenth_box BaseClass)
5   v_but_box = geomSize (tenth_edge -TenthGrid)
6   v_tenth_box = geomButting (v_tenth_box v_but_box
      keep = = 2)
7   edge_v_edge_box = geomButting
      (edge_tenth_box v_tenth_box)
8   edge_v_edge = geomGetEdge (edge_v_edge box butting
      InEdge)
9   edge_v_stch = geomStretch (edge_v_edge StchSize)
10  edge_v_stch = geomAndNot (edge_v_stch edge_v_edge)
11  edge_v_stch_box = geomSize (edge_v_stch TenthGrid)
12  edge_v_stch_box = geomButting (edge_v_stch_box
      v_tenth_box)
13  edge_v_stch = geomGetEdge (edge_v_stch_box butting
      edge_v_stch)
14  edge_v_stch = geomStretch (edge_v_stch TenthGrid)
15  edge_v_stch = geomOr (edge_v_stch)
16  edge_v_stch = geomStretch (edge_v_stch -TenthGrid)
```

The above routine convex_stch.rul stretches the input edge segments which are forming a convex vertex. The algorithm takes BaseClass, StchSize, and InEdge as inputs to specify the base class objects where the vertices are resident, the stretch amount, and the input edge segments, respectively. The InEdge is an edge segment set which is used to find the convex vertices created and stretch the corresponding edges outwards from the vertices. The edges can be of a different wide class object from BaseClass.

Generally, correcting a minimum spacing rule violation between a non-design geometry and one or more wide class objects of a design geometry can be accomplished by enlarging a wide class object of the design geometry, for example, by the wide class minimum spacing rule amount, and deducting the enlarged wide class object from the non-design geometry. The wide class object is enlarged at all non-virtual edges, but not at any virtual edges. The enlarging includes any corner areas formed by two non-virtual edges which are joined, for example, perpendicularly.

Correction of Spacing Violations Between Design Geometries and Wide Class Objects of Dummy Geometries In addition to correcting spacing rule violations between dummy geometries and wide class objects of design geometries as described in flow 500, spacing rule violations must be corrected between design geometries and wide class objects of dummy geometries.

FIGS. 6A–6G illustrate the manipulation of dummy geometries to correct spacing violations between design geometries and wide class objects of the dummy geometries according to some embodiments of the present invention. FIGS. 7A–7D illustrate flows 700 and 750 for correcting spacing violations between design geometries and wide class objects of dummy geometries according to some embodiments of the present invention. A different process to correct spacing violations between design geometries and wide class objects of dummy geometries is used from that described in flow 500 because design geometries cannot be cut and therefore the violation information has to be reflected back to the dummy geometry from the design geometry and then the dummy geometry is cut to conform to the minimum spacing design rule.

Figure 6B:
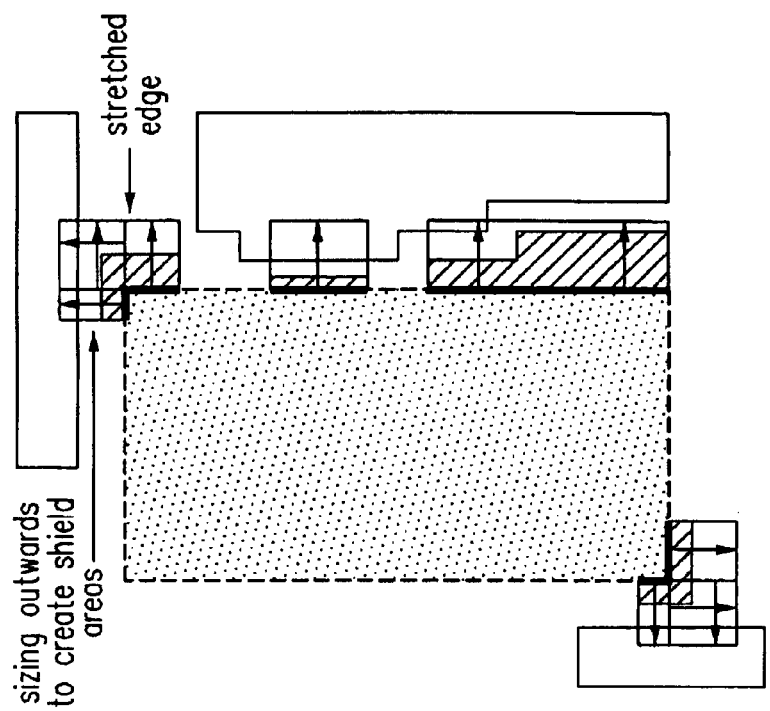
FIGS. 6A–6G illustrate the manipulation of dummy geometries to correct spacing violations between design geometries and wide class objects of the dummy geometries according to some embodiments of the present invention.
Figure 6A:
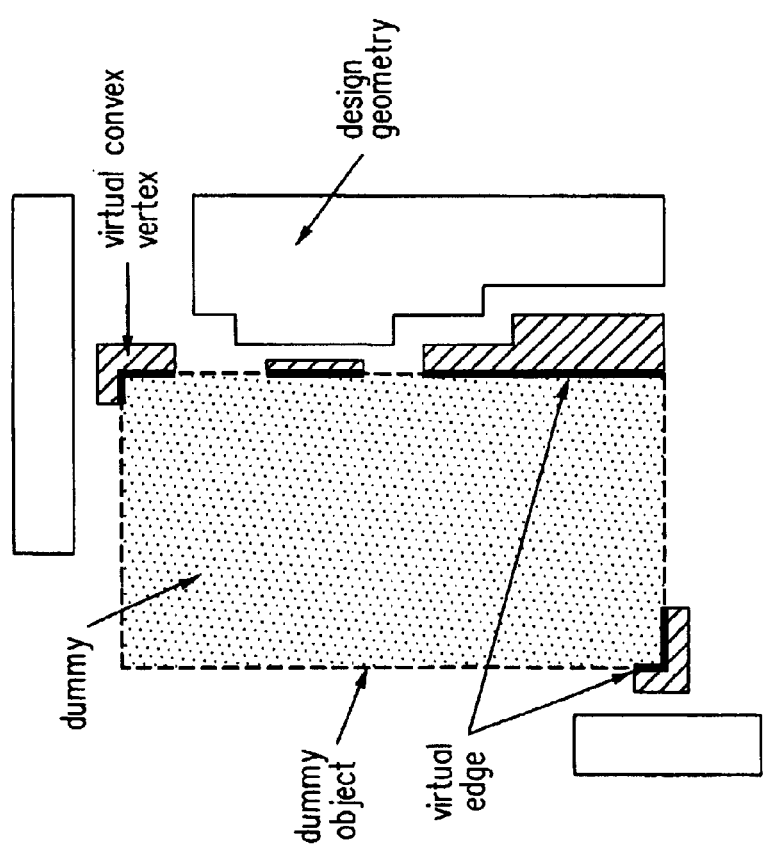
Figure 6D:
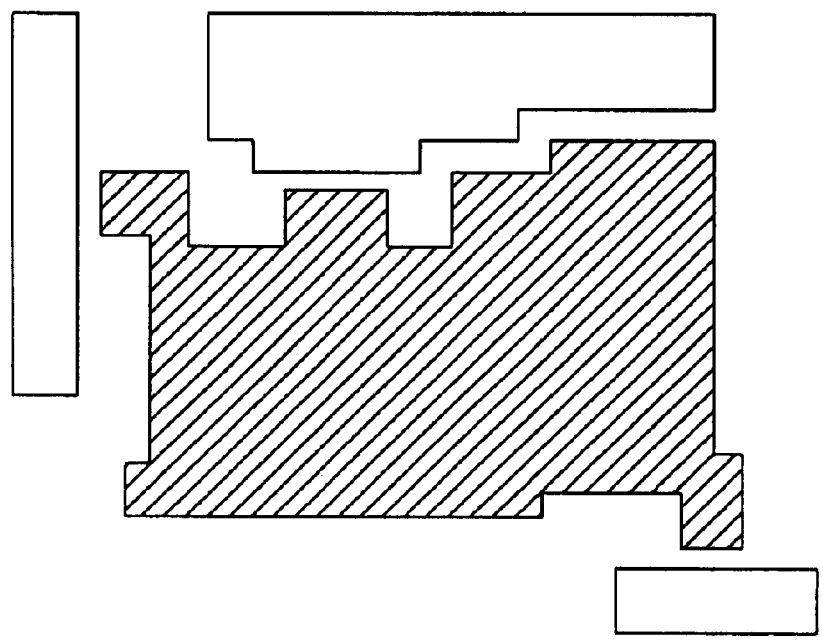
Figure 6C:
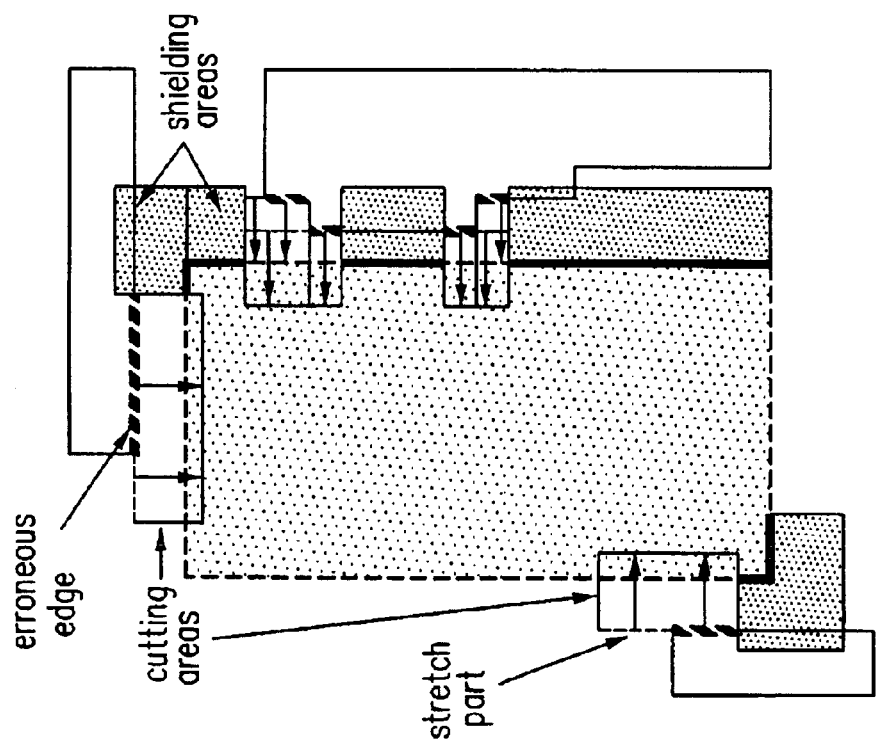

Flow 700 is repeated for each wide class object $w_0$ to $w_n$, step 702. Wide class objects $w_i$ of dummy geometries are calculated, step 704. Note that $w_0$ wide class objects do not need to be derived because all edges of $w_0$ wide class objects are coincident with edges of the dummy geometries. As illustrated in FIGS. 6A–6B, shielding areas are created by stretching and sizing virtual edges and vertices of wide class objects of dummy geometries toward design geometries, step 706. As illustrated in FIG. 6C, erroneous edges of design geometries are enlarged, but not into shielding areas, to create cutting areas on the dummy geometries, step 708. The shielding areas are used to block portions of erroneous edges of design geometries from stretching and sizing into them. As illustrated in FIG. 6D, cutting areas are deducted from the dummy geometries, step 710.

FIGS. 6A–B and FIG. 7B illustrate step 706, creating shielding areas, in further detail according to some embodiments of the present invention. To create shielding areas for a specific wide class object of dummy geometries, virtual edges and virtual convex vertices are specially handled. A wide class object of the dummy geometry, two virtual convex vertices of the wide class object of the dummy geometry, and several virtual edge segments of the wide class object of the dummy geometry are illustrated in FIG. 6A. For virtual edges not touching a virtual convex vertex, the virtual edge is sized outward by the $w_i$ minimum spacing rule amount to create shielding areas for each corresponding virtual edge, step 732. For virtual edges touching a virtual convex vertex of a $w_i$ wide class object of a dummy geometry, the ends of the virtual edges touching the virtual convex vertex are first stretched by $w_i$ minimum spacing rule amount. Next, the stretched virtual edges are sized by $w_i$ minimum spacing rule amount to create shielding areas, step 734. The ordering of steps 732 and 734 is not important, and can alternatively occur simultaneously.

FIGS. 6C and 7C illustrate step 708, finding and enlarging erroneous edges to create cutting areas, in further detail according to some embodiments of the present invention. Edges of design geometries that violate the wi minimum spacing rules with respect to non-virtual edges of wide class objects of dummy geometries are identified, step 742. The erroneous design geometry edges are stretched in both directions by the $w_i$ minimum spacing rule amount, step 744. Stretched portions of the erroneous design geometry edges which are not in shielding areas, which are abutting their original edge, and which are not in design geometries are sized outward by the $w_i$ minimum spacing rule amount to create cutting areas on dummy geometries, step 746.

Figure 6G:
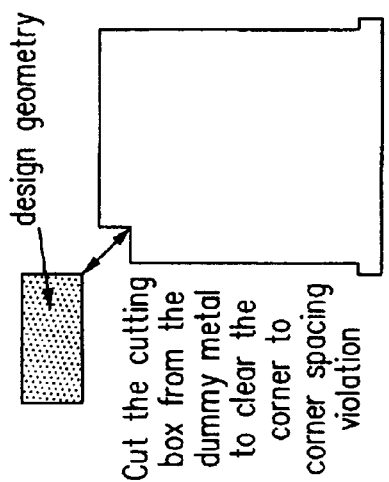
Figure 6F:
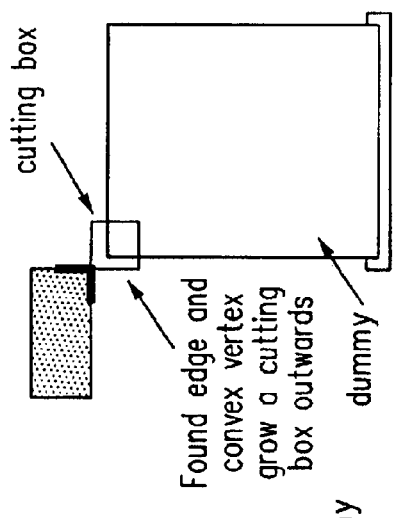
Figure 6E:
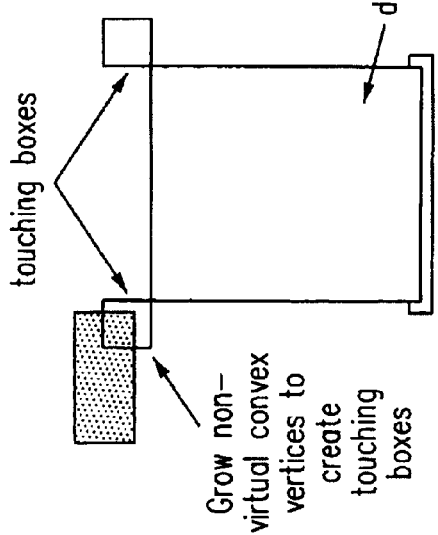
Figure 7D:
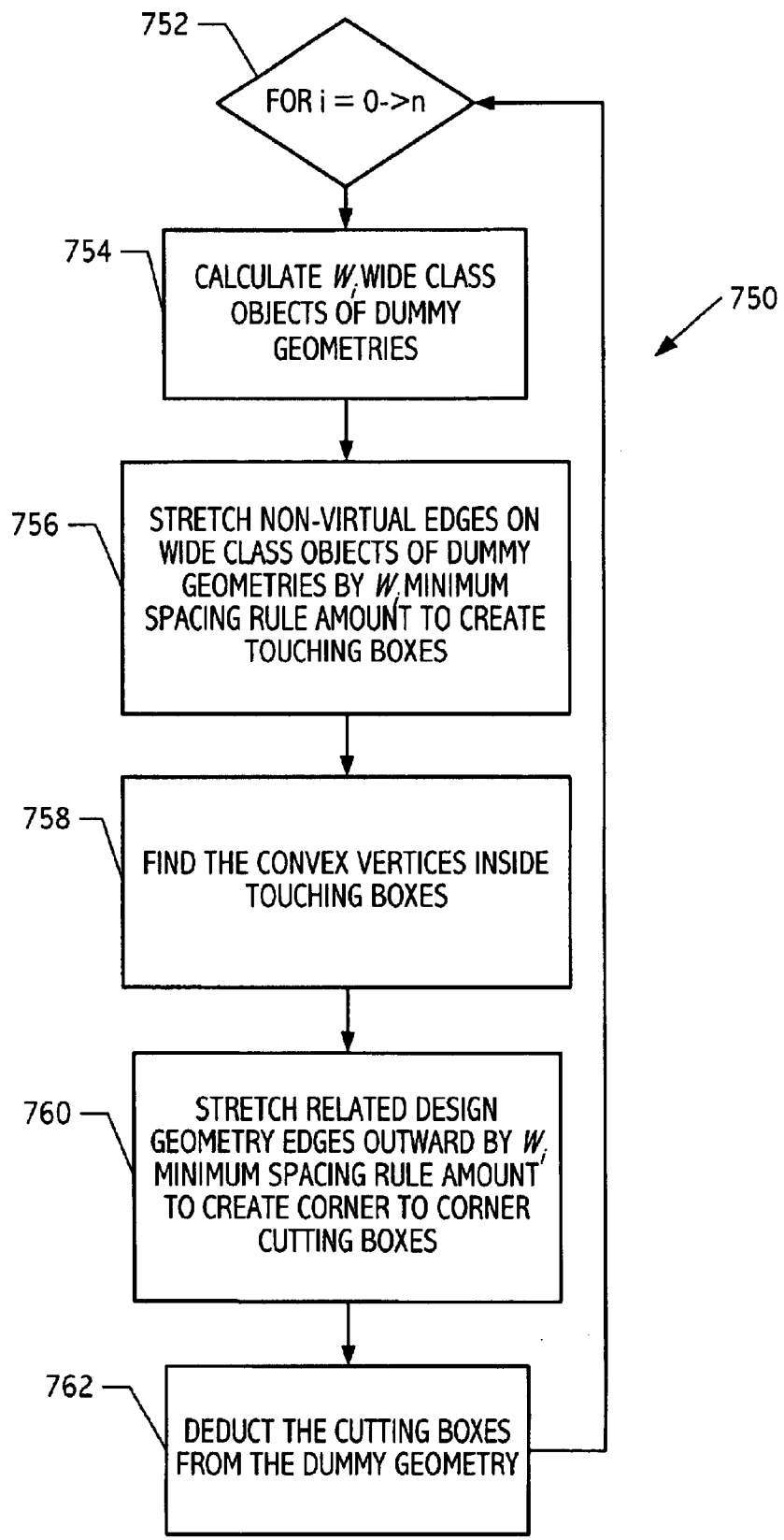

As illustrated above, flow 700 corrects rule violations between the edges of the geometries, but not the corner to corner rule violations. FIGS. 6E–6G and FIG. 7D illustrate a flow 750 for corner to corner error correction between design geometries and wide class objects of dummy geometries. Flow 750 is repeated for each wide class object $w_0$–$w_n$ of dummy geometries, step 752. The wide class objects of the dummy geometries must be re-calculated because the dummy geometries may have changed due to previous operations, step 754. As illustrated in FIG. 6E, the non-virtual edges on the wide class objects of the dummy geometries are stretched by the $w_i$ minimum spacing rule amount to create touching boxes, step 756. The convex vertices inside the touching boxes are found, step 758. According to one embodiment, the design geometry edges inside the touching boxes are first found and then are used to find the convex vertices inside the touching boxes. This is performed, for example, due to a tool limitation that does not provide for easily finding convex vertices. As illustrated in FIG. 6F, the edges of the found convex vertices of the design geometry are stretched outward by the $w_i$ minimum spacing rule amount to create corner to corner cutting areas, step 760. As illustrated in FIG. 6G, the cutting areas are deducted from the dummy geometries, step 762.

According to another embodiment of the present invention, flows 700 and 750 can be combined and performed at the same time, for example, by performing the derivation of the wide class objects, then steps 704–710 and then steps 756–762.

Although flow 750 can be performed prior to flow 700, flow 750 is optimally performed after flow 700 because flow 700 can reduce the size of dummy geometries and wide class objects and therefore the spacing requirements. Thus, a more optimal layout is created having no more than the minimum spacing between geometries. For similar reasons, flows 700 and 750 are optimally performed after flow 500.

An exemplary Diva language code segment is illustrated below for correcting minimum spacing violations between design geometries and wide class objects of dummy geometries for a design with three wide classes according to some embodiments of the present invention.

```
1    exist_mt = geomCat (m1_good)
2    w0 = geomCat (dummy)
3    MtxWidth =M1Width
4    rule_file = sprintf (nil "%s/diva_rules/
     wdumymt_mt_cut_box.rul" DFII_TECH_DIR)
5    MtxWide = M1Wide1
6    MtxToMtxWide = M1ToM1Wide1
7    load (rule_file)
8    MtxWide = M1Wide2
9    MtxToMtxWide = M1ToM1Wide2
10   load (rule_file)
11   MtxWide = M1Wide3
12   MtxToMtxWide = M1ToM1Wide3
13   load (rule_file)
14   dummy = geomCat (w0)
```

The above routine sets up and calls a routine wdumymt_mt_cut_box.rul three times to correct spacing rule violations between design geometries and wide class objects of dummy geometries. The routine wdumymt_mt_cut_box.rul receives wmt, w0, exist_mt and WmtToMt as inputs and outputs cut_box, which contains areas ready to be deducted from dummy geometries. The routine wdumymt_mt_cut_box.rul is illustrated below.

```
1    size_f = MtxWide/2-TenthGrid
2    wmt = geomSize (geomSize (w0 -size_f) size_f)
3    wmt = geomAnd (wmt w0)
4    edge_ck = geomGetEdge (wmt coincident w0)
5    vtx_rule_file = sprintf (nil "%s/diva_rules/convex_stch.rul"
     DFII_TECH_DIR)
6    v_edge = geomAndNot (geomGetEdge (wmt) edge_ck)
7    BaseClass = geomCat (wmt)
8    StchSize = MtxToMtxWide
9    InEdge = geomCat (v_edge)
10   load (vtx_rule_file)
11   v_edge_v_stch = geomOr (v_edge edge_v_stch)
12   v_edge_v_sheild_box = geomSize (v_edge_v_stch
     MtxToMtxWide)
13   error = drc (edge_ck exist_mt sep < MtxToMtxWide opposite
     edgeb)
14   error_stch = geomStretch (error MtxToMtxWide)
15   stch = geomAndNot (error_stch error)
16   stch_box = geomSize (stch TenthGrid)
17   error_box = geomSize (error TenthGrid)
18   sheild_box = geomOr (exist_mt v_edge_v_sheild_box)
19   stch_box_outside = geomAndNot (stch_box sheild_box)
20   good_stch_box = geomButting (stch_box_outside error_box)
21   good_box = geomOr (good_stch_box error_box)
22   error_stch = geomGetEdge (error_stch butting good_box)
23   cut_box = geomSize (error_stch MtxToMtxWide)
24   w0 = geomAndNot (w0 cut_box)
25   size_f = MtxWidth/2-TenthGrid
26   w0 = geomSize (geomSize (w0 -size_f) size_f)
27   size_f = MtxWide/2-TenthGrid
28   wmt = geomSize (geomSize (w0 -size_f) size_f)
29   wmt_edge = geomGetEdge (wmt coincident w0)
30   BaseClass = geomCat (w0)
31   StchSize = MtxToMtxWide
32   InEdge = geomCat (wmt_edge)
33   load (vtx_rule_file)
34   touch_box = geomSize (edge_v_stch MtxToMtxWide)
35   BaseClass = geomCat (exist_mt)
36   StchSize = MtxToMtxWide
37   InEdge = geomGetEdge (exist_mt over touch_box)
```

-continued

```
38  load (vtx_rule_file)
39  cut_box = geomSize (edge_v_stch MtxToMtxWide)
40  w0 = geomAndNot (w0 cut_box)
41  size_f = MtxWidth/2-TenthGrid
42  w0 = geomSize (geomSize (w0 -size_f) size_f)
```

Lines 1–3 calculate the $w_i$ wide class object using the standard sizing down and sizing up operations.

Lines 4–26 correspond to operations performed in flow 700. Lines 4–12 perform step 706, creating shielding areas by getting the real edges of the $w_i$ wide class object in line 4, getting the virtual edges of the wide class object in line 6, and stretching and sizing virtual edges in lines 10–12 (similar to steps 732 and 734). Lines 13–23 perform step 708, stretching erroneous edges of design geometries to create cutting areas on dummy geometries. In more detail, line 13 finds design geometry edges violating dummy object spacing rules, line 14 stretches those erroneous edges, lines 15–16 define minimum resolution boxes of stretched portions of erroneous edges, here labeled "TenthGrid." For example, a TenthGrid box has an edge of at least one tenth of one grid. The minimum resolution boxes are defined so that the edges can be more easily manipulated. Line 17 defines minimum resolution boxes of erroneous edges. Line 18 creates shielding boxes. Line 19 obtains the minimum resolution boxes of stretched edges not in shielding boxes. Line 20 obtains only those minimum resolution boxes of stretched edges (not in shielding areas) that are coincident with original edges. Lines 21–22 obtain the edges from the identified minimum resolution boxes. Those edges are sized in line 23 to form cutting boxes. The cutting boxes are deducted in line 24. Lines 25–26 remove any slivers of dummy geometries by performing a sizing down and sizing up operation.

Lines 27–42 correspond to operations performed in flow 750. Lines 27–34 perform step 756, stretching non-virtual edges on wide class objects of dummy geometries by the $w_i$ minimum spacing rule amount to create touching boxes. Lines 35–37 perform step 758, finding design geometry edges inside touching boxes and finding the convex vertices inside touching boxes. Lines 38–39 perform step 760, stretching related design geometry edges outward by the $w_i$ minimum spacing rule amount to create corner to corner cutting boxes. Line 40 deducts the corner to corner cutting boxes from dummy geometries. Lines 41–42 remove any slivers of dummy geometries by performing a sizing down and sizing up operation.

Inside the above routine, the routine convex_stch.rul, as described previously, is used to stretch the convex vertices which are formed by two wide class non-virtual edge segments by given wide class spacing.

Generally, correcting minimum spacing rule violations between design geometries and wide class objects of non-design geometries can be accomplished by deducting an enlarged design geometry from the non-design geometry. The enlarged design geometry is formed by enlarging the design geometry at erroneous boundaries toward any non-virtual boundaries of a wide class object of a non-design geometry avoiding shielding areas around any virtual edges of the wide class object of the non-design geometry.

Correction of Spacing Violations Between Wide Class Objects of Dummy Geometries

In addition to correcting spacing rule violations between dummy geometries and wide class objects of design geometries as described in flow 500, and correcting spacing rule violations between design geometries and wide class objects of dummy geometries as described in flows 700 and 750, spacing rule violations must be corrected between wide class objects of dummy geometries. A different process is used from those described above because when two dummy geometries have a minimum spacing violation, both can be cut to meet the minimum spacing rule. Even if the dummy geometries added to the design layout were initially violation free, the cutting operations in flows 500, 700 and 750 might have created spacing rule violations between wide class objects of dummy geometries, for example, when one dummy geometry is split into two or more pieces.

Figure 8B:
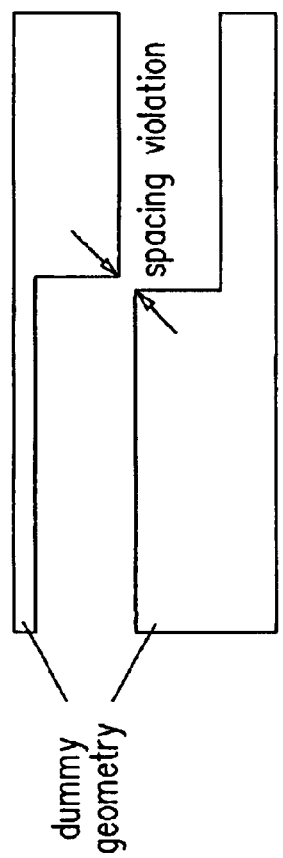
FIGS. 8A–8B illustrate an example of how a spacing violation between dummy geometries is created according to some embodiments of the present invention.
Figure 8A:
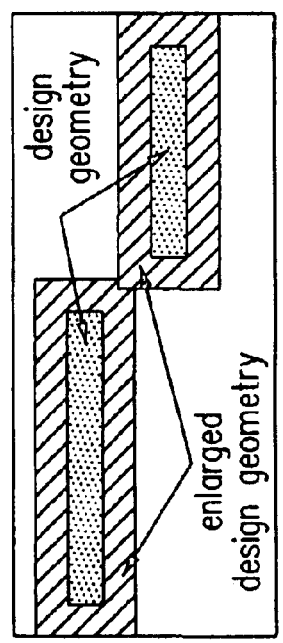

FIGS. 8A–8B illustrate an example of how a spacing violation between dummy geometries is created when dummy geometries are cut, for example, by any of the aforementioned flows. As illustrated, when design geometries are enlarged by minimum spacing (for example, in flow 500), one large dummy geometry is cut into two pieces, resulting in a spacing violation between the two pieces of dummy geometries.

For a design with multiple wide classes, virtual edges in the wide class objects are specially handled. A spacing violation could occur between two $w_0$ class objects in which one or both would have to be cut to conform to the $w_0$ minimum spacing rule. The violation also could occur between a $w_i$ class object and $w_0$ class object ($0 < i \leq n$) in which the $w_0$ class object would be cut to conform to the $w_i$ minimum spacing rule.

Figure 9C:
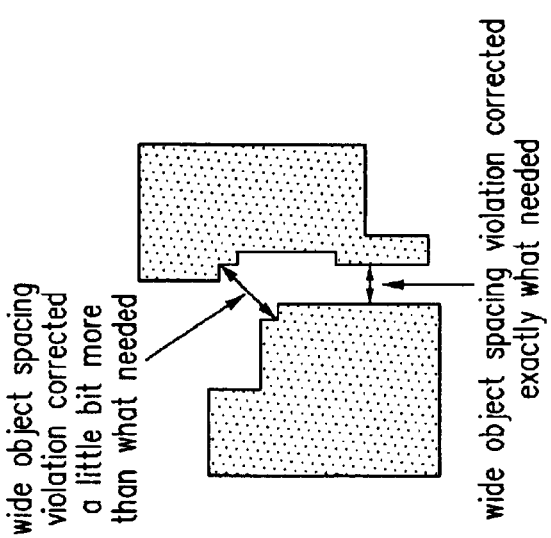
FIGS. 9A–9C illustrate the manipulation of dummy geometries to correct spacing violations between wide class objects of dummy geometries according to some embodiments of the present invention.
Figure 9B:
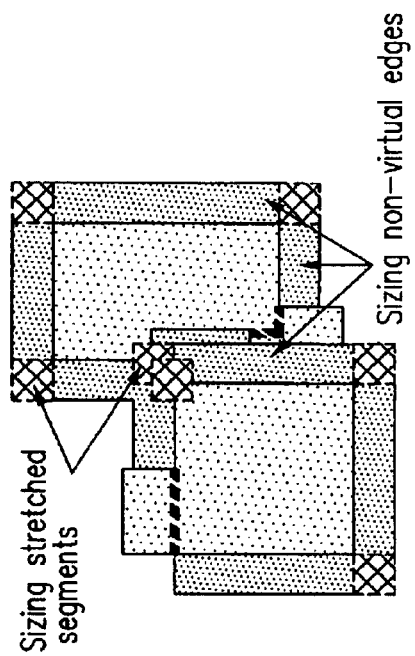
Figure 9A:
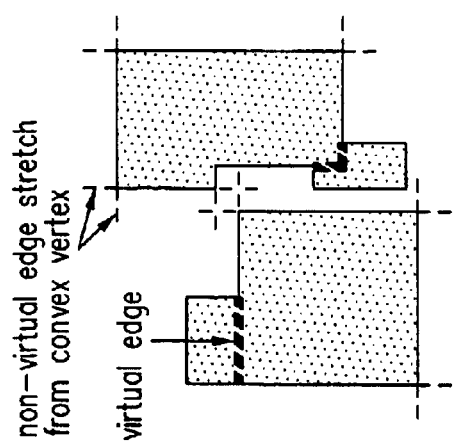
Figure 10:
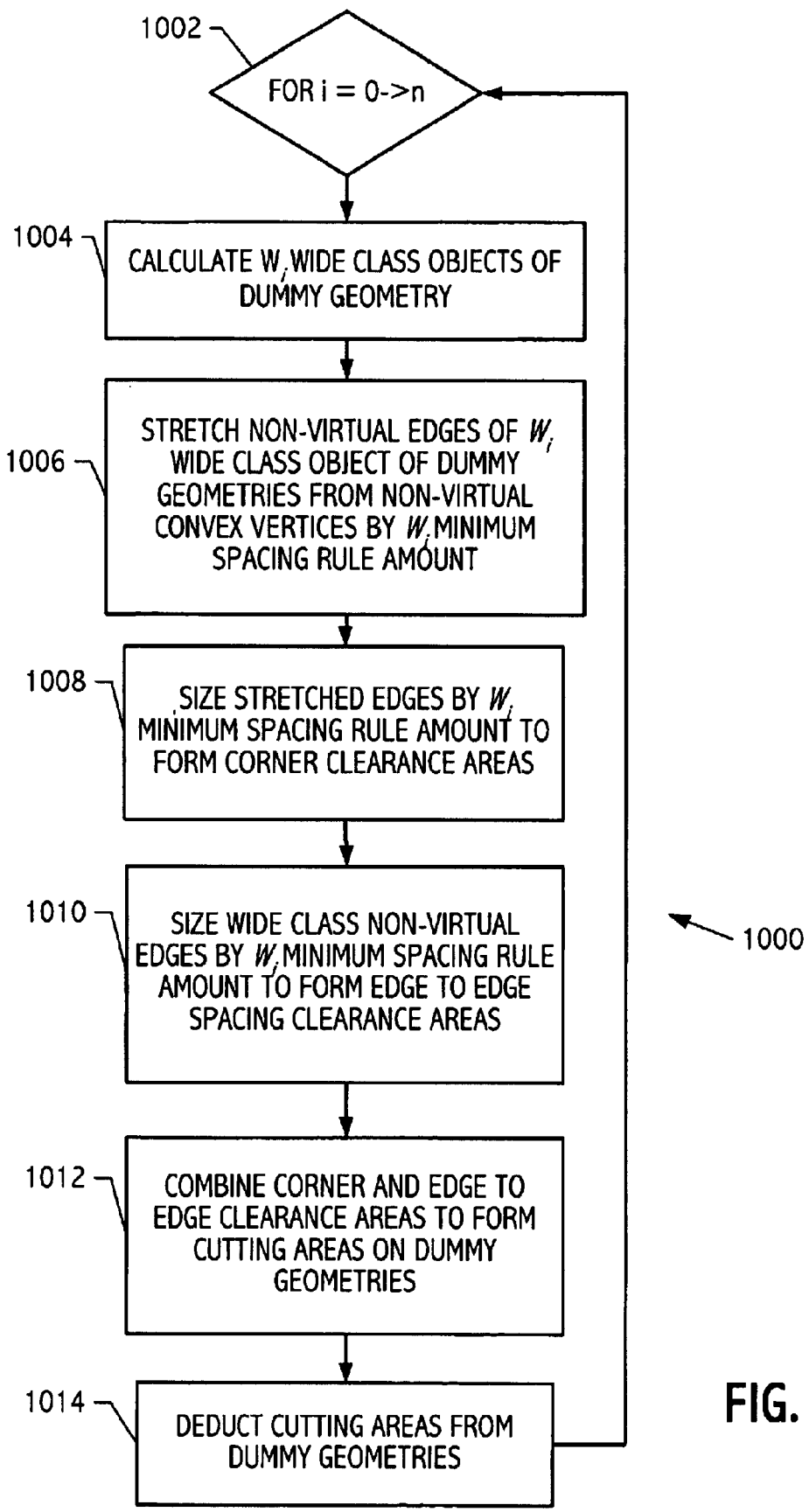
FIG. 10 illustrates a flow 1000 for correcting spacing violations between wide class objects of dummy geometries according to some embodiments of the present invention.

FIGS. 9A–9C illustrate the manipulation of dummy geometries to correct spacing violations between wide class objects of dummy geometries according to some embodiments of the present invention. FIG. 10 illustrates a flow 1000 for correcting spacing violations between wide class objects of dummy geometries according to some embodiments of the present invention. Flow 1000 is repeated for each wide class object $w_0$–$W_n$ of the dummy geometries, step 1002. The $w_i$ wide class objects of the dummy geometries must be re-calculated because the dummy geometries may have changed due to previous operations, step 1004. The flow is applied from $w_0$–$w_n$, because whenever a $w_0$ object is cut, wide class objects might be reshaped. As illustrated in FIG. 9A, the non-virtual edges of the $w_i$ wide class object of dummy geometries are stretched from the non-virtual convex vertices outwards by the $w_i$ minimum spacing rule amount, step 1006. As illustrated in FIG. 9B, the stretched edge segments are sized by the $w_i$ minimum spacing rule amount to form clearance square areas for possible corner to corner spacing violations, step 1008. As illustrated in FIG. 9B, the wide class non-virtual edges are sized by the $w_i$ minimum spacing rule amount to form edge to edge spacing clearance areas, step 1010. As illustrated in FIG. 9B, the corner and edge clearance areas are combined together to form the cutting areas, step 1012. As illustrated in FIG. 9C, the cutting areas are deducted to correct the spacing violations, step 1014.

In another embodiment of the present invention, rather than first combining the corner and edge to edge clearance areas to form cutting areas on dummy geometries, corner and edge to edge clearance areas can each be deducted from the dummy geometries.

An exemplary Diva language code segment to correct spacing violations between dummy geometries and wide class objects of other dummy geometries is illustrated below. The routine dumy_self_spacing.rul is called four times, once for each of $w_0$, $w_1$, $w_2$ and $w_3$ to define cutting boxes. Lines 6, 10, 14 and 18 deduct the cutting boxes from the dummy geometries.

```
1   w0 = geomCat (dummy)
2   MtxWide = M1Width
3   MtxToMtxWide = M1ToM1
4   rule_file = sprintf (nil "%s/diva_rules/dumy_self_spacing.rul"
    DFII_TECH_DIR)
5   load (rule_file)
6   w0 = geomAndNot (w0 cut_box)
7   MtxWide = M1Wide1
8   MtxToMtxWide = M1ToM1Wide1
9   load (rule_file)
10  w0 = geomAndNot (w0 cut_box)
11  MtxWide = M1Wide2
12  MtxToMtxWide = M1ToM1Wide2
13  load (rule_file)
14  w0 = geomAndNot (w0 cut_box)
15  MtxWide = M1Wide3
16  MtxToMtxWide = M1ToM1Wide3
17  load (rule_file)
18  w0 = geomAndNot (w0 Cut_box)
```

Below is the routine dumy_self_spacing.rul which takes MtxWide and MtxToMtxWide as inputs and outputs cut_box, which contains areas to be deducted from dummy geometries. The routine dumy_self_spacing.rul calls the routine convex_stch.rul, described previously, is used to extract the non-virtual convex vertices formed by two non-virtual wide object edge segments.

```
1   size_f = MtxWide/2-TenthGrid
2   wmt = geomSize (geomSize (w0 -size_f) size_f); wide
3   wmt = geomAnd (wmt w0)
4   BaseClass = geomCat (w0)
5   StchSize = MtxToMtxWide
6   InEdge = geomGetEdge (wmt coincident w0)
7   vtx_rule_file = sprintf (nil "%s/diva_rules/convex_stch.rul"
    DFII_TECH_DIR)
8   load (vtx_rule_file)
9   v_cut_box = geomSize (edge_v_stch MtxToMtxWide)
10  edge_cut_box = geomSize (InEdge MtxToMtxWide)
11  cut_box = geomOr (edge_cut_box v_cut_box)
```

Lines 1–3 of the routine dumy_self_spacing.rul calculate the $w_i$ wide object class of the dummy geometries. Lines 4–8 perform step 1006, stretching non-virtual edges of $w_i$ wide class objects of dummy geometries from non-virtual convex vertices by the $w_i$ minimum spacing rule amount. Line 9 performs step 1008, sizing the stretched edges by the $w_i$ minimum spacing rule amount to form corner clearance areas. Line 10 performs step 1010, sizing wide class non-virtual edges by $w_i$ minimum spacing rule amount to form edge to edge spacing clearance areas. Line 11 performs step 1012, combining the corner and edge to edge clearance areas to form cutting areas on dummy geometries.

If a $w_i$ spacing violation occurs between the edges $w_i$ wide class objects of different geometries, the geometries are cut by an extra amount because the algorithm treats each $w_i$ wide class object equally. However, if a $w_i$ spacing violation occurs between the edges of a $w_i$ wide class object of one geometry and the edges of another geometry, only the another geometry is cut and the area cut is only the required area to meet the minimum spacing rule. The extra area cut varies depending on the original separation. The closer the two objects are, the larger the extra area cut. Because $w_i$ objects are contained in a $w_{i-1}$ objects and spacing violation correction is performed from i=0 to n, $w_i$ objects are already separated by at least the $w_{i-1}$ minimum spacing rule amount. Thus, the extra area cut is less than or equal to the w minimum spacing rule amount minus the $w_{i-1}$ minimum spacing rule amount.

Generally, correcting spacing violations between wide class objects of non-design geometries can be accomplished by deducting an enlarged wide class object of a first non-design geometry from a second non-design geometry. The enlarged wide class object of the first non-design geometry is formed by enlarging a wide class object of the first non-design geometry at non-virtual edges but not at virtual edges. The enlarging includes any corner areas formed by two non-virtual edges which are joined, for example, perpendicularly.

Correction of Width Violations of Dummy Geometries

After performing the spacing violation correction process, dummy geometries can be cut into different shapes. For example, a dummy geometry can be cut in opposite directions, which could introduce dummy geometry width violations. Although some width violations can be corrected by traditional sizing down and sizing up operations, others need special handling.

Figure 11A:
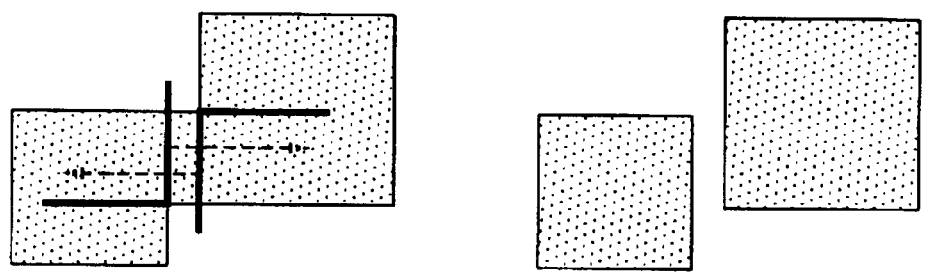
FIGS. 11A–11D illustrate various exemplary dummy geometries, some having width violations.
Figure 11B:
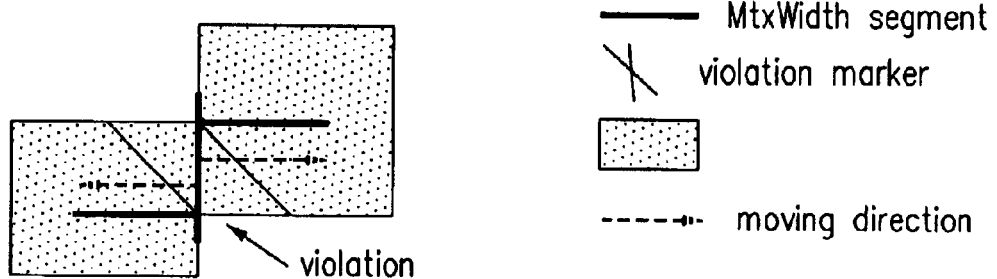
Figure 11C:
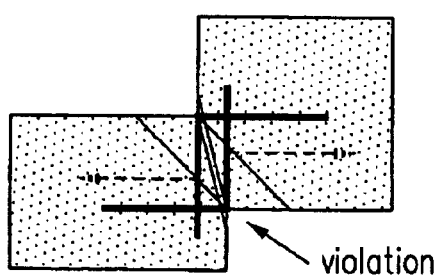
Figure 11D:
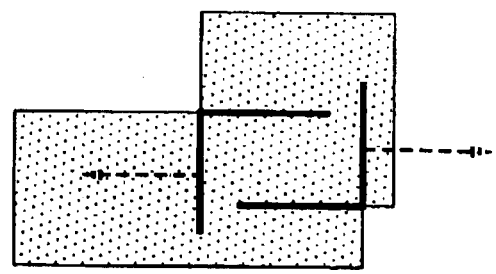

FIGS. 11A–11D illustrate exemplary dummy geometries, some having width violations. FIG. 11A illustrates a geometry with a width violation that can be corrected by sizing down and sizing up operations. FIGS. 11B–11C illustrate various geometries with width violations that can not be corrected by sizing down and sizing up operations. FIG. 11D illustrates a geometry without a width violation.

To determine if a dummy geometry has a width violation, edges touching concave vertices are stretched by the minimum width rule amount to form stretched segments. If a stretched segment crosses an original edge as illustrated in FIG. 11A, the geometry has a width violation which can be fixed by traditional sizing down and sizing up operations. If a stretched segment crosses another stretched segment on concave vertices or perpendicularly as illustrated in FIGS. 11B–11C, the dummy geometry has a width violation which cannot be fixed by traditional sizing down and sizing up operations. If a stretched segment does not cross another stretched segment, then the geometry does not have a width violation as illustrated in FIG. 11D.

Figure 13:
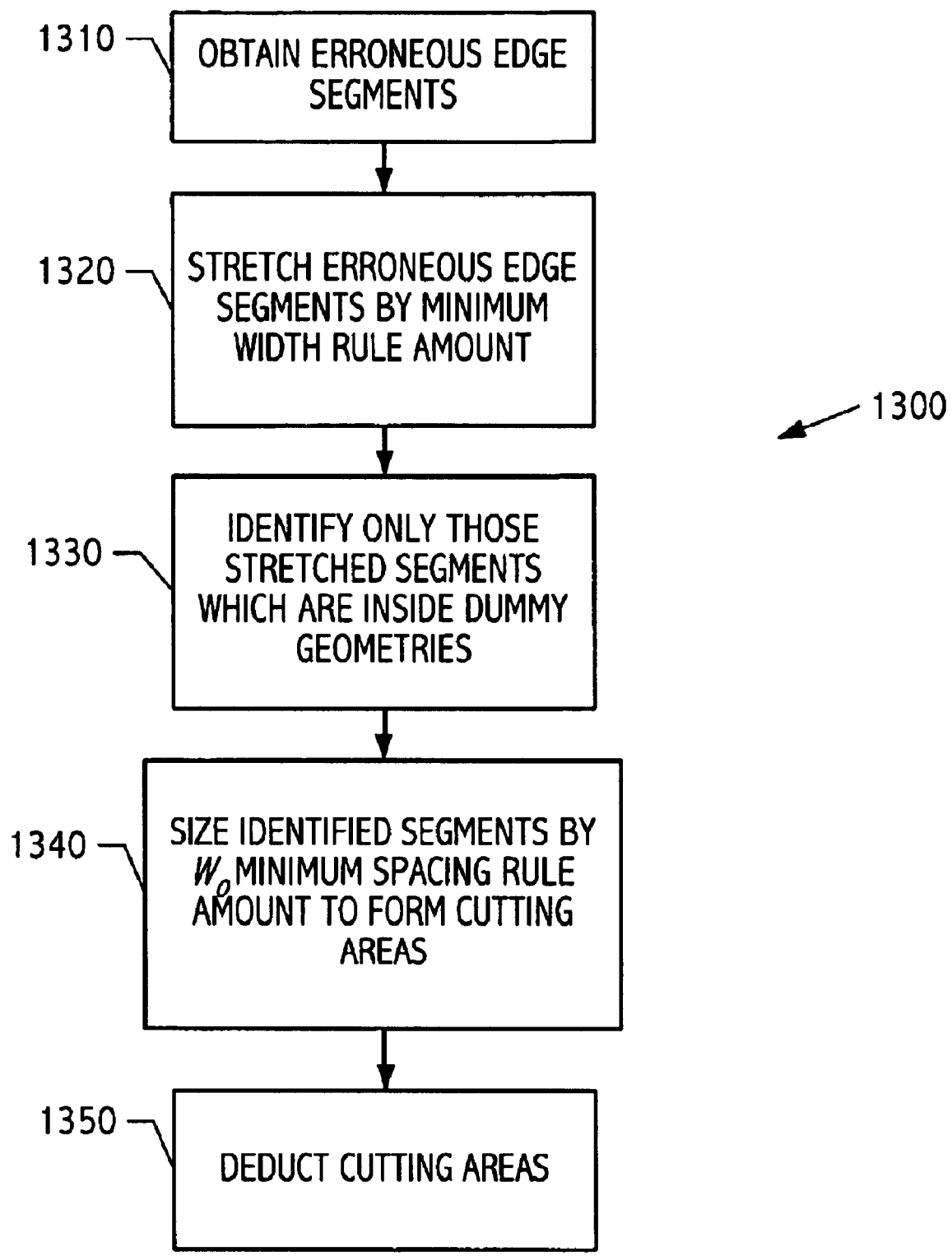
FIG. 13 illustrates a flow 1300 for correction of width violations of dummy geometries according to some embodiments of the present invention.

FIGS. 12A–12F illustrate the manipulation of dummy geometries to correct width violations of dummy geometries according to some embodiments of the present invention. FIG. 13 illustrates a flow 1300 for correction of width violations of dummy geometries according to some embodiments of the present invention.

FIG. 12A illustrates the creation of a width violation due to correction of spacing violations between design geometries and dummy geometries, for example, from flow 500.

Referring to FIGS. 12B–12D and FIG. 13, erroneous edge segments are obtained from the erroneous geometries, step 1310. According to one embodiment of the invention, erroneous edge segments are not easily obtained and DRC error marker geometries generated by an electronic design automation (EDA) tool are used to obtain the erroneous edge segments. DRC error marker geometries have irregular shapes and might be offgrid. For example, by obtaining violation error markers using the characteristics of the DRC error marker geometries, the error markers can be used to guide the flow to correct the violation. This kind of marker traditionally is used to help users visually find and identify the error, so that the errors can be fixed manually. The marker is used as a clue to guide the algorithm to the erroneous geometries, and then to the erroneous edge segments. Because among the erroneous edges there must be at least two points which are separated by less than the minimum width rule amount (otherwise there would not be an error), if the erroneous edge segments are stretched by the $w_i$ minimum width rule amount inside the dummy geometry, the stretched parts cross each other as shown in FIG. 12D. Thus, the surrounding areas has at least one dimension less than the minimum width rule amount, causing the erroneous area to be found.

As illustrated in FIG. 12D, the edge segments are stretched by the minimum width rule amount, step 1320, guaranteeing that the segments are stretched into the dummy geometry by the minimum width rule amount, and cross in the opposite direction perpendicularly. The stretched edge segments must cross each other if there is a width violation. In addition, the area surrounded by the stretched segments must be less than the minimum width rule amount in both directions, otherwise the area would have been eliminated by sizing down and sizing up operations. Stretched segments which are inside the dummy geometry are identified, step 1330. As illustrated in FIG. 12E, the identified stretched edge segments are sized outward by the $w_0$ minimum spacing rule amount to form cutting areas, step 1340. Note that the edges are stretched by the minimum width amount and then sized by the $w_0$ minimum spacing rule amount. As illustrated in FIG. 12F, the cutting areas are deducted from the dummy geometries, step 1350.

As illustrated in FIG. 12F, slivers can be created by the cutting area deduction operations. These slivers have both dimensions less than the minimum width rule amount and can be removed by performing sizing down and sizing up operations.

An exemplary Diva language code segment to correct width violations in dummy geometries is illustrated below.

```
1    error_fig = drc (dm_mtx width < MtxWidth fig)
2    error = drc (dm_mtx width < MtxWidth)
3    edge = geomGetEdge (error_fig coincident error)
4    edge_stch = geomStretch (edge MtxWidth)
5    edge_stch = geomGetEdge (edge_stch inside dm_mtx)
6    edge_stch_box = geomSize (edge_stch MtxToMtx)
7    dm_mtx = geomAndNot (dm_mtx edge_stch_box)
8    size_f = MtxWidth/2-TenthGrid
9    dm_mtx = geomSize (geomSize (dm_mtx -size_f) size_f)
```

The above routine performs flow 1300, correcting width violations in dummy geometries. Lines 1–3 performs step 1310, obtaining erroneous edge segments. Line 4 performs step 1320, stretching the erroneous edge segments by the minimum width rule amount. Line 5 performs step 1330, identifying only those stretched segments which are inside dummy geometries. Line 6 performs step 1340, sizing the identified segments by the $w_0$ minimum spacing rule amount to form cutting areas. Line 7 performs step 1350, deducting the cutting areas. Lines 8–9 remove any slivers of dummy geometries by performing a sizing down and sizing up operation.

Generally, correcting minimum width rule violations of non-design geometries is accomplished by forming one or more cutting areas adjoining one or more erroneous edges of a non-design geometry, and deducting the cutting areas form the non-design geometry, splitting the non-design geometry into two or more remaining non-design geometries. Any slivers of remaining non-design geometries, i.e., any pieces that are smaller than a minimum size amount, are removed.

Flows 300, 500, 700, 750, 1000 and 1300 are utilized for correction of design rule violations when adding dummy geometries to a design layout according to some embodiments of the invention. It is appreciated that operations discussed herein may consist of directly entered commands by a computer system user, but the preferred embodiment includes steps executed by software modules. The functionality of step referred to herein may correspond to the functionality of modules or portions of modules. In addition to software modules, the above flows or portions of flows can be implemented as application instructions or menu items. For example, a sizing operation which only sizes non-virtual edges of an object by a sizing factor can be an application instruction provided by an EDA tool provider according to some embodiments of the present invention.

The operations referred to herein may be modules or portions of modules (e.g., software, firmware, or hardware modules). For example, the software modules discussed herein may include script, batch or other executable files, or combinations and/or portions of such files. The software modules may include a computer program or subroutines thereof encoded on computer-readable media.

Additionally, those skilled in the art will recognize that the boundaries between modules are merely illustrative and alternative embodiments may merge modules or impose an alternative decomposition of functionality of modules. For example, the modules discussed herein may be decomposed into sub-modules to be executed as multiple computer processes. Moreover, alternative embodiments may combine multiple instances of a particular module or sub-module. Furthermore, those skilled in the art will recognize that the operations described in exemplary embodiments are for illustration only. Operations may be combined or the functionality of the operations may be distributed in additional operations in accordance with the invention.

Thus, the flows described herein, the operations thereof and modules therefore may be executed on a computer system configured to execute the operations of the flows and/or may be executed from computer-readable media. The flows may be embodied in a machine-readable and/or computer-readable medium for configuring a computer system to execute the flows. Thus, the software modules may be stored within and/or transmitted to a computer system memory to configure the computer system to perform the functions of the module.

The flows described herein can be applied to an entire design layout or portions thereof. For example, applying a flow to a smaller portion of a design layout can be performed to improve EDA tool performance, or as portions of the design layout are completed, or when only a portion of the design layout needs an increased density, or any other similar reason.

Although the above embodiments have been described in relation to dummy geometries, embodiments of the present invention can be applied to any non-design geometry or geometries which can be cut.

Although the above embodiments have been described in relation to Cadence EDA tools and code segments utilizing Diva language code, the techniques described herein can be applicable to and make use of any EDA tools, electronic circuit layout, and implemented in any code language.

Although the above embodiments have been described in relation to integrated circuit layouts, the techniques described herein can be equally useful in the layout of other electronic devices, for example in a layout of a printed wiring board.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A method for use in connection with a design layout of an electronic circuit, the design layout having non-design geometries, the method comprising:
    deducting an enlarged wide class object of a first non-design geometry from a second non-design geometry;
    wherein the enlarged wide class object of the first non-design geometry is formed by enlarging a wide class object of the first non-design geometry at one or more non-virtual edges of the wide class object of the first non-design geometry but not at one or more virtual edges of the wide class object of the first non-design geometry wherein the wide class object of the first non-design geometry has at least one virtual edge.

2. The method, as recited in claim 1, further comprising:
    deducting an enlarged wide class object of the second non-design geometry from the first non-design geometry;
    wherein the enlarged wide class object of the second non-design geometry is formed by enlarging a wide class object of the second non-design geometry at one or more non-virtual edges of the wide class object of the second non-design geometry.

3. The method, as recited in claim 2, wherein the wide class object of the first geometry is of a same wide class as the wide class object of the second design geometry and more area is deducted from the first non-design geometry and the second non-design geometry than is needed to meet a minimum spacing rule.

4. The method, as recited in claim 2, wherein the wide class object of the first geometry is of a different wide class as the wide class object of the second design geometry and only enough area is deducted from the first non-design geometry and the second non-design geometry to meet a minimum spacing rule.

5. The method, as recited in claim 1, wherein the enlarging the wide class object of the first non-design geometry comprises:
    creating corner clearance areas from non-virtual convex vertices of the wide class object of the first non-design geometry;
    creating edge to edge spacing clearance areas from non-virtual edges of the wide class object of the first non-design geometry; and
    combining the corner clearance areas and the edge to edge spacing clearance areas to form the enlarged wide class object of the first non-design geometry.

6. The method, as recited in claim 5, wherein the creating corner clearance areas comprises:
    stretching non-virtual edges that form the non-virtual convex vertices of the wide class object of the first non-design geometry by a minimum spacing rule amount creating stretched edges; and
    sizing the stretched edges by the minimum spacing rule amount.

7. The method, as recited in claim 5, wherein the creating edge to edge spacing clearance areas comprises:
    sizing non-virtual edges of the wide class object of the first non-design geometry by a minimum spacing rule amount.

8. The method, as recited in claim 1, wherein the first non-design geometry and the second non-design geometry are dummy geometries.

9. A method of processing one or more design files for an electronic circuit, the one or more design files encoding representations of a design layout of the electronic circuit, the design layout having non-design geometries, the method comprising:
    deducting an enlarged wide class object of a first non-design geometry from a second non-design geometry;
    wherein the enlarged wide class object of the first non-design geometry is formed by enlarging a wide class object of the first non-design geometry at one or more non-virtual edges of the wide class object of the first non-design geometry but not at one or more virtual edges of the wide class object of the first non-design geometry wherein the wide class object of the first non-design geometry has at least one virtual edge.

10. The method, as recited in claim 9, further comprising:
    deducting an enlarged wide class object of the second non-design geometry from the first non-design geometry;
    wherein the enlarged wide class object of the second non-design geometry is formed by enlarging a wide class object of the second non-design geometry at one or more non-virtual edges of the wide class object of the second non-design geometry.

11. The method, as recited in claim 10, wherein the wide class object of the first geometry is of a same wide class as the wide class object of the second design geometry and more area is deducted from the first non-design geometry and the second non-design geometry than is needed to meet a minimum spacing rule.

12. The method, as recited in claim 10, wherein the wide class object of the first geometry is of a different wide class as the wide class object of the second design geometry and only enough area is deducted from the first non-design geometry and the second non-design geometry to meet a minimum spacing rule.

13. The method, as recited in claim 9, wherein the enlarging the wide class object of the first non-design geometry comprises:
    creating corner clearance areas from non-virtual convex vertices of the wide class object of the first non-design geometry;
    creating edge to edge spacing clearance areas from non-virtual edges of the wide class object of the first non-design geometry; and
    combining the corner clearance areas and the edge to edge spacing clearance areas to form the enlarged wide class object of the first non-design geometry.

14. The method, as recited in claim 13, wherein the creating corner clearance areas comprises:
    stretching non-virtual edges that form the non-virtual convex vertices of the wide class object of the first non-design geometry by a minimum spacing rule amount creating stretched edges; and
    sizing the stretched edges by the minimum spacing rule amount.

15. The method, as recited in claim 13, wherein the creating edge to edge spacing clearance areas comprises:
    sizing non-virtual edges of the wide class object of the first non-design geometry by a minimum spacing rule amount.

16. The method, as recited in claim 9, wherein the first non-design geometry and the second non-design geometry are dummy geometries.

17. An electronic circuit comprising:
   plurality of non-design geometries;
   wherein a design layout of the electronic circuit was generated by:
      deducting an enlarged wide class object of a first non-design geometry from a second non-design geometry;
      wherein the enlarged wide class object of the first non-design geometry is formed by enlarging a wide class object of the first non-design geometry at one or more non-virtual edges of the wide class object of the first non-design geometry but not at one or more virtual edges of the wide class object of the first non-design geometry wherein the wide class object of the first non-design geometry has at least one virtual edge.

18. The electronic circuit, as recited in claim 17, wherein the design layout of the electronic circuit was further generated by:
   deducting an enlarged wide class object of the second non-design geometry from the first non-design geometry;
   wherein the enlarged wide class object of the second non-design geometry is formed by enlarging a wide class object of the second non-design geometry at one or more non-virtual edges of the wide class object of the second non-design geometry.

19. The electronic circuit, as recited in claim 18, wherein the wide class object of the first geometry is of a same wide class as the wide class object of the second design geometry and more area is deducted from the first non-design geometry and the second non-design geometry than is needed to meet a minimum spacing rule.

20. The electronic circuit, as recited in claim 18, wherein the wide class object of the first geometry is of a different wide class as the wide class object of the second design geometry and only enough area is deducted from the first non-design geometry and the second non-design geometry to meet a minimum spacing rule.

21. The electronic circuit, as recited in claim 17, wherein the enlarging the wide class object of the first non-design geometry comprises:
   creating corner clearance areas from non-virtual convex vertices of the wide class object of the first non-design geometry;
   creating edge to edge spacing clearance areas from non-virtual edges of the wide class object of the first non-design geometry; and
   combining the corner clearance areas and the edge to edge spacing clearance areas to form the enlarged wide class object of the first non-design geometry.

22. The electronic circuit, as recited in claim 21, wherein the creating corner clearance areas comprises:
   stretching non-virtual edges that form the non-virtual convex vertices of the wide class object of the first non-design geometry by a minimum spacing rule amount creating stretched edges; and
   sizing the stretched edges by the minimum spacing rule amount.

23. The electronic circuit, as recited in claim 21, wherein the creating edge to edge spacing clearance areas comprises:
   sizing non-virtual edges of the wide class object of the first non-design geometry by a minimum spacing rule amount.

24. The electronic circuit, as recited in claim 17, wherein the first non-design geometry and the second non-design geometry are dummy geometries.

25. A computer readable encoding of an electronic circuit design, the computer readable encoding comprising:
   one or more design file media encoding representations of a plurality of non-design geometries;
   wherein the computer readable encoding of the electronic circuit design was generated by:
      deducting an enlarged wide class object of a first non-design geometry from a second non-design geometry;
      wherein the enlarged wide class object of the first non-design geometry is formed by enlarging a wide class object of the first non-design geometry at one or more non-virtual edges of the wide class object of the first non-design geometry but not at one or more virtual edges of the wide class object of the first non-design geometry wherein the wide class object of the first non-design geometry has at least one virtual edge.

26. The computer readable encoding, as recited in claim 25, wherein the computer readable encoding of the electronic circuit design was further generated by:
   deducting an enlarged wide class object of the second non-design geometry from the first non-design geometry;
   wherein the enlarged wide class object of the second non-design geometry is formed by enlarging a wide class object of the second non-design geometry at one or more non-virtual edges of the wide class object of the second non-design geometry.

27. The computer readable encoding, as recited in claim 26, wherein the wide class object of the first geometry is of a same wide class as the wide class object of the second design geometry and more area is deducted from the first non-design geometry and the second non-design geometry than is needed to meet a minimum spacing rule.

28. The computer readable encoding, as recited in claim 26, wherein the wide class object of the first geometry is of a different wide class as the wide class object of the second design geometry and only enough area is deducted from the first non-design geometry and the second non-design geometry to meet a minimum spacing rule.

29. The computer readable encoding, as recited in claim 25, wherein the enlarging the wide class object of the first non-design geometry comprises:
   creating corner clearance areas from non-virtual convex vertices of the wide class object of the first non-design geometry;
   creating edge to edge spacing clearance areas from non-virtual edges of the wide class object of the first non-design geometry; and
   combining the corner clearance areas and the edge to edge spacing clearance areas to form the enlarged wide class object of the first non-design geometry.

30. The computer readable encoding, as recited in claim 29, wherein the creating corner clearance areas comprises:
   stretching non-virtual edges that form the non-virtual convex vertices of the wide class object of the first non-design geometry by a minimum spacing rule amount creating stretched edges; and
   sizing the stretched edges by the minimum spacing rule amount.

31. The computer readable encoding, as recited in claim 29, wherein the creating edge to edge spacing clearance areas comprises:

sizing non-virtual edges of the wide class object of the first non-design geometry by a minimum spacing rule amount.

32. The computer readable encoding, as recited in claim 25, wherein the first non-design geometry and the second non-design geometry are dummy geometries.

33. An apparatus comprising:

means for processing one or more design files for an electronic circuit, the one or more design files encoding representations of a design layout of the electronic circuit, the design layout having non-design geometries, the means for processing comprising:

means for deducting an enlarged wide class object of a first non-design geometry from a second non-design geometry;

wherein the enlarged wide class object of the first non-design geometry is formed by means for enlarging a wide class object of the first non-design geometry at one or more non-virtual edges of the wide class object of the first non-design geometry but not at one or more virtual edges of the wide class object of the first non-design geometry wherein the wide class object of the first non-design geometry has at least one virtual edge.

34. The apparatus, as recited in claim 33, the means for processing further comprising:

means for deducting an enlarged wide class object of the second non-design geometry from the first non-design geometry;

wherein the enlarged wide class object of the second non-design geometry is formed by means for enlarging a wide class object of the second non-design geometry at one or more non-virtual edges of the wide class object of the second non-design geometry.

35. The apparatus, as recited in claim 34, wherein the wide class object of the first geometry is of a same wide class as the wide class object of the second design geometry and more area is deducted from the first non-design geometry and the second non-design geometry than is needed to meet a minimum spacing rule.

36. The apparatus, as recited in claim 34, wherein the wide class object of the first geometry is of a different wide class as the wide class object of the second design geometry and only enough area is deducted from the first non-design geometry and the second non-design geometry to meet a minimum spacing rule.

37. The apparatus, as recited in claim 33, wherein the means for enlarging the wide class object of the first non-design geometry comprises:

means for creating corner clearance areas from non-virtual convex vertices of the wide class object of the first non-design geometry;

means for creating edge to edge spacing clearance areas from non-virtual edges of the wide class object of the first non-design geometry; and means for combining the corner clearance areas and the edge to edge spacing clearance areas to form the enlarged wide class object of the first non-design geometry.

38. The apparatus, as recited in claim 37, wherein the means for creating corner clearance areas comprises:

means for stretching non-virtual edges that form the non-virtual convex vertices of the wide class object of the first non-design geometry by a minimum spacing rule amount creating stretched edges; and means for sizing the stretched edges by the minimum spacing rule amount.

39. The apparatus, as recited in claim 37, wherein the means for creating edge to edge spacing clearance areas comprises:

means for sizing non-virtual edges of the wide class object of the first non-design geometry by a minimum spacing rule amount.

40. The apparatus, as recited in claim 33, wherein the first non-design geometry and the second non-design geometry are dummy geometries.

41. A method of making a computer readable media product that encodes a design file representation of a design layout of an electronic circuit, the design layout having non-design geometries, the method comprising:

deducting an enlarged wide class object of a first non-design geometry from a second non-design geometry;

wherein the enlarged wide class object of the first non-design geometry is formed by enlarging a wide class object of the first non-design geometry at one or more non-virtual edges of the wide class object of the first non-design geometry but not at one or more virtual edges of the wide class object of the first non-design geometry wherein the wide class object of the first non-design geometry has at least one virtual edge.

42. The method, as recited in claim 41, wherein the computer readable media product is embodied as one or more media selected from the set of a disk, tape, or other magnetic, optical, semiconductor or electronic storage medium and a network, wire line, wireless of other communications medium.

* * * * *

UNITED STATES PATENT AND TRADEMARK OFFICE
CERTIFICATE OF CORRECTION

PATENT NO.   : 6,792,586 B2
DATED        : September 14, 2004
INVENTOR(S)  : Mu-Jing Li It is certified that error appears in the above-identified patent and that said Letters Patent is hereby corrected as shown below:

Column 8,
Line 38, the words "the sized p" should read -- the sized up --.
Line 65, the words "edge_v_edge box" should read -- edge _v_edge_box --.

Column 11,
Line 24, the words "the wi minimum" should read -- the $w_i$ minimum --.
Line 28, the words "the w, minimum," should read -- the $w_i$ minimum --.

Column 15,
Line 65, the words "to the w" should read -- to the $w_i$ --.

Signed and Sealed this

First Day of February, 2005

JON W. DUDAS
*Director of the United States Patent and Trademark Office*

UNITED STATES PATENT AND TRADEMARK OFFICE
CERTIFICATE OF CORRECTION

PATENT NO.   : 6,792,586,B2
DATED        : September 14, 2004
INVENTOR(S)  : Mu-Jing Li It is certified that error appears in the above-identified patent and that said Letters Patent is hereby corrected as shown below:

Column 8,
Line 38, the words "the sized p" should read -- the sized up --.

Column 9,
Line 65, the words "edge_v_edge box" should read -- edge_v_edge_box --.

Column 11,
Line 24, the words "the wi minimum" should read -- the $w_i$ minimum --.
Line 28, the words "the w, minimum" should read -- the $w_i$ minimum --.

Column 15,
Line 65, the words "to the w" should read -- to the $w_i$ --.

Signed and Sealed this

Third Day of May, 2005

JON W. DUDAS
*Director of the United States Patent and Trademark Office*